US011127655B2

(12) United States Patent
Moriyama et al.

(10) Patent No.: US 11,127,655 B2
(45) Date of Patent: Sep. 21, 2021

(54) MEMORY DIE CONTAINING THROUGH-MEMORY-LEVEL VIA STRUCTURE AND METHODS FOR MAKING THE SAME

(71) Applicant: SANDISK TECHNOLOGIES LLC, Addison, TX (US)

(72) Inventors: Takumi Moriyama, Yokkaichi (JP); Hiroshi Sasaki, Yokkaichi (JP); Yohei Masamori, Yokkaichi (JP); Satoshi Shimizu, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 28 days.

(21) Appl. No.: 16/295,292

(22) Filed: Mar. 7, 2019

(65) Prior Publication Data
US 2020/0286815 A1 Sep. 10, 2020

(51) Int. Cl.
*H01L 23/48* (2006.01)
*H01L 27/11582* (2017.01)
(Continued)

(52) U.S. Cl.
CPC ...... *H01L 23/481* (2013.01); *H01L 21/76831* (2013.01); *H01L 21/76898* (2013.01);
(Continued)

(58) Field of Classification Search
None
See application file for complete search history.

(56) References Cited

U.S. PATENT DOCUMENTS

| 5,915,167 A | 6/1999 | Leedy |
|---|---|---|
| 10,115,681 B1 | 10/2018 | Ariyoshi |

(Continued)

FOREIGN PATENT DOCUMENTS

| WO | WO2017112014 A1 | 6/2017 |
|---|---|---|
| WO | WO2017213720 A1 | 12/2017 |

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Moazzam Hossain
*Assistant Examiner* — Stanetta D Isaac
(74) *Attorney, Agent, or Firm* — The Marbury Law Group PLLC

(57) ABSTRACT

An alternating stack of insulating layers and spacer material layers is formed over a substrate. At least one dielectric material portion is formed over the substrate adjacent to the alternating stack. Memory stack structures are formed through the alternating stack. A trench extending through the alternating stack and a via cavity extending through the at least one dielectric material portion are formed using a same anisotropic etch process. The via cavity is deeper than the trench and the via cavity extends into an upper portion of the substrate. The sacrificial material layers are replaced with electrically conductive layers using the trench as a conduit for an etchant and a reactant. A trench fill structure is formed in the trench, and a via structure assembly is formed in the via cavity using simultaneous deposition of material portions. A bonding pad may be formed on the bottom surface of the via structure assembly.

16 Claims, 36 Drawing Sheets

(51) Int. Cl.
*H01L 27/11556* (2017.01)
*H01L 25/00* (2006.01)
*H01L 21/768* (2006.01)
*H01L 25/065* (2006.01)

(52) U.S. Cl.
CPC .......... *H01L 25/0657* (2013.01); *H01L 25/50* (2013.01); *H01L 27/11556* (2013.01); *H01L 27/11582* (2013.01)

(56) References Cited

U.S. PATENT DOCUMENTS

2015/0179660 A1* 6/2015 Yada ................. H01L 21/02164
257/321
2017/0077027 A1* 3/2017 Shimizu ............. H01L 27/1157

OTHER PUBLICATIONS

U.S. Appl. No. 15/873,101, filed Jan. 17, 2018, Sandisk Technologies LLC.
U.S. Appl. No. 15/892,648, filed Feb. 9, 2018, Sandisk Technologies LLC.
U.S. Appl. No. 15/928,340, filed Mar. 22, 2018, Sandisk Technologies LLC.
U.S. Appl. No. 15/928,407, filed Mar. 22, 2018, Sandisk Technologies LLC.
U.S. Appl. No. 15/960,267, filed Apr. 23, 2018, Sandisk Technologies LLC.
U.S. Appl. No. 15/979,885, filed May 15, 2018, Sandisk Technologies LLC.
U.S. Appl. No. 16/231,752, filed Dec. 24, 2018, Sandisk Technologies LLC.
U.S. Appl. No. 16/242,216, filed Jan. 8, 2019, Sandisk Technologies LLC.
U.S. Appl. No. 16/248,923, filed Jan. 16, 2019, Sandisk Technologies LLC.
U.S. Appl. No. 16/249,423, filed Jan. 16, 2019, Sandisk Technologies LLC.
U.S. Appl. No. 16/255,413, filed Jan. 23, 2019, Sandisk Technologies LLC.
U.S. Appl. No. 16/269,301, filed Feb. 6, 2019, Sandisk Technologies LLC.
U.S. Appl. No. 16/274,687, filed Feb. 13, 2019, Sandisk Technologies LLC.
U.S. Appl. No. 16/275,668, filed Feb. 14, 2019, Sandisk Technologies LLC.
U.S. Appl. No. 16/278,372, filed Feb. 18, 2019, Sandisk Technologies LLC.
U.S. Appl. No. 16/284,502, filed Feb. 25, 2019, Sandisk Technologies LLC.
U.S. Appl. No. 16/288,656, filed Feb. 28, 2019, Sandisk Technologies LLC.
U.S. Appl. No. 16/291,457, filed Mar. 4, 2019, Sandisk Technologies LLC.
U.S. Appl. No. 16/291,504, filed Mar. 4, 2019, Sandisk Technologies LLC.
U.S. Appl. No. 16/291,577, filed Mar. 4, 2019, Sandisk Technologies LLC.
Notification of Transmittal of the International Search Report and Written Opinion of the International Search Authority for International Patent Application No. PCT/US2019/063159, dated Mar. 30, 2020, 10 pages.

* cited by examiner

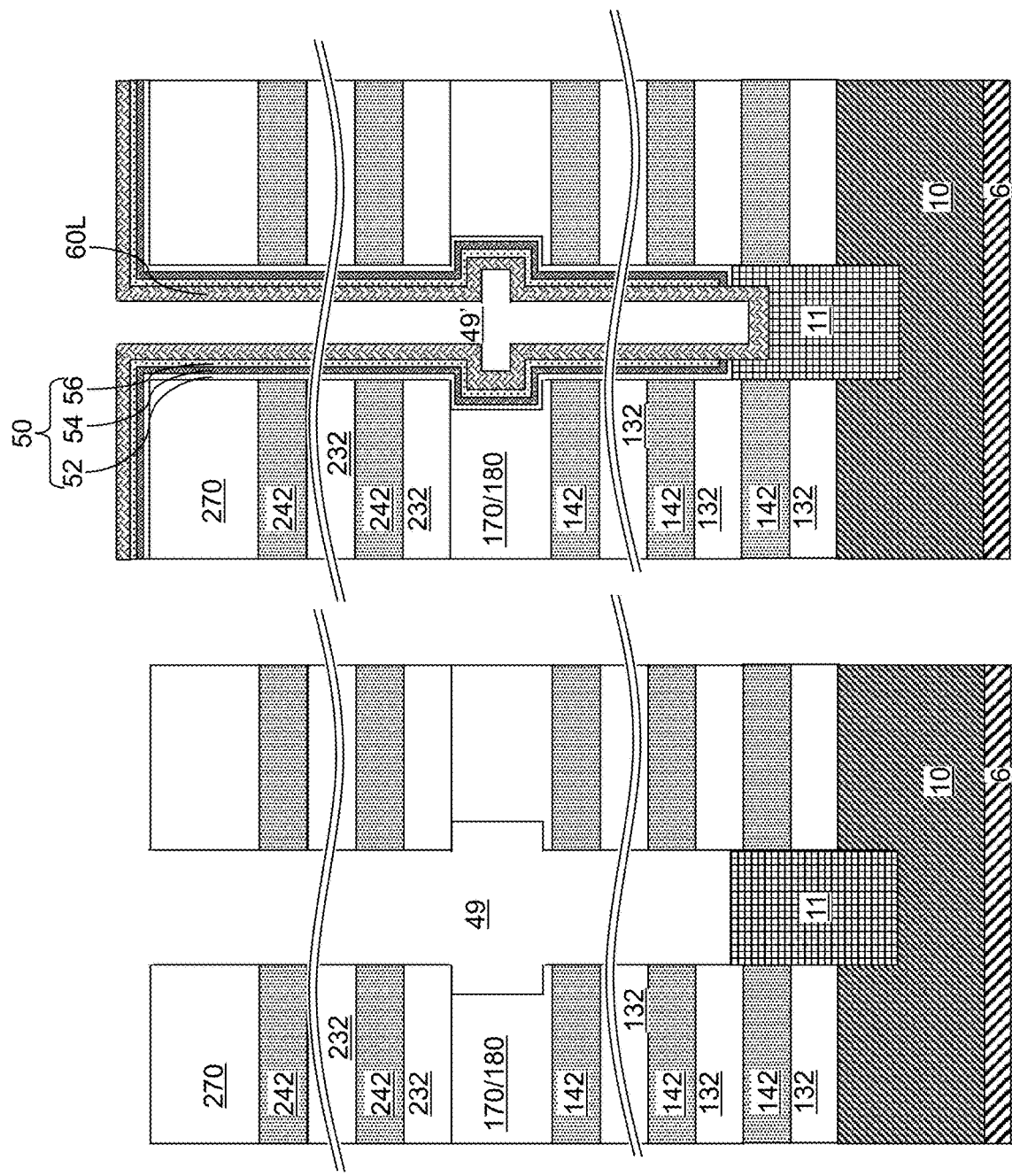

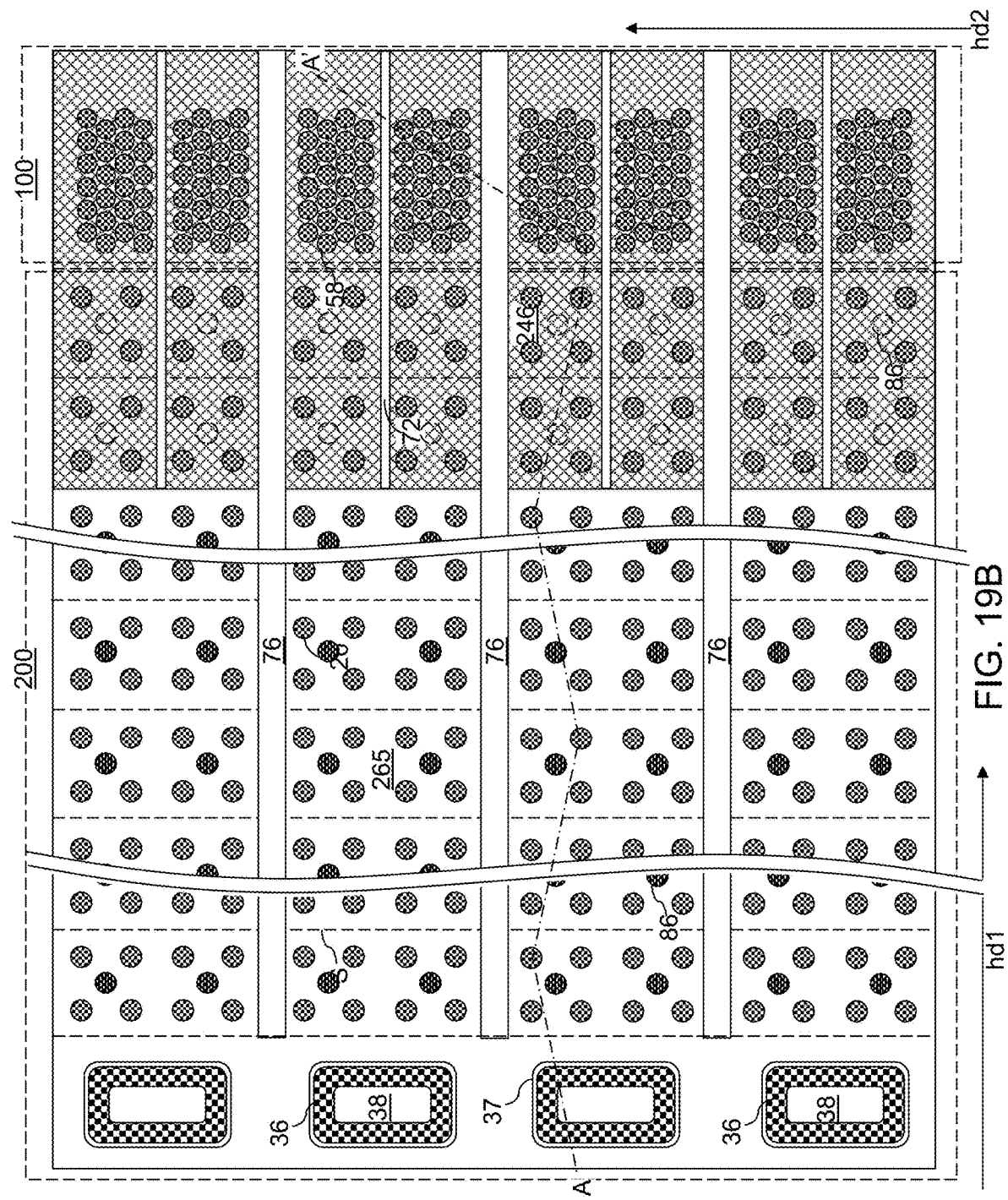

MEMORY DIE CONTAINING THROUGH-MEMORY-LEVEL VIA STRUCTURE AND METHODS FOR MAKING THE SAME

FIELD

The present disclosure relates generally to the field of semiconductor devices, and particularly to a memory die including a through-memory-level via structure and methods for making the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a semiconductor structure comprising a memory die is provided. The memory die comprises: an alternating stack of insulating layers and electrically conductive layers located between a substrate and metal interconnect structures; memory stack structures extending through the alternating stack; at least one dielectric material portion located between the substrate and the metal interconnect structures and adjacent to the alternating stack; and a via structure assembly vertically extending through the at least one dielectric material portion and through the substrate with a straight sidewall that extends from a first horizontal surface that contacts one of the metal interconnect structures and located at a first horizontal plane to a second horizontal surface that is located at a second horizontal plane and contacts a bonding pad located on an outer surface of the substrate, wherein the via structure assembly comprises: a tubular conductive portion extending from the first horizontal surface to the second horizontal surface; a planar conductive portion contacting the bonding pad at the second horizontal surface; and a dielectric via core located within the tubular conductive portion.

According to another embodiment of the present disclosure, a method of forming a semiconductor structure is provided, which comprises: forming an alternating stack of insulating layers and spacer material layers over a substrate; forming at least one dielectric material portion over the substrate adjacent to the alternating stack; forming memory stack structures through the alternating stack; forming a trench extending through the alternating stack and a via cavity extending through the at least one dielectric material portion using a same anisotropic etch process, wherein the via cavity is deeper than the trench, and wherein the via cavity extends partially into the substrate; forming a trench fill structure in the trench and a via structure assembly in the via cavity using simultaneous deposition of material portions in the trench and the via cavity; physically exposing a bottom surface of the via structure assembly by thinning the substrate from a backside; and forming a bonding pad on the bottom surface of the via structure assembly.

BRIEF DESCRIPTION OF THE DRAWINGS

FIGS. 9A-9D illustrate sequential vertical cross-sectional views of a memory opening during formation of a memory opening fill structure according to an embodiment of the present disclosure.

FIG. 19B is a horizontal cross-sectional view of the exemplary structure along the vertical plane B-B' of FIG. 19A. The hinged vertical plane A-A' corresponds to the plane of the vertical cross-sectional view of FIG. 19A.

DETAILED DESCRIPTION

Figure 1:
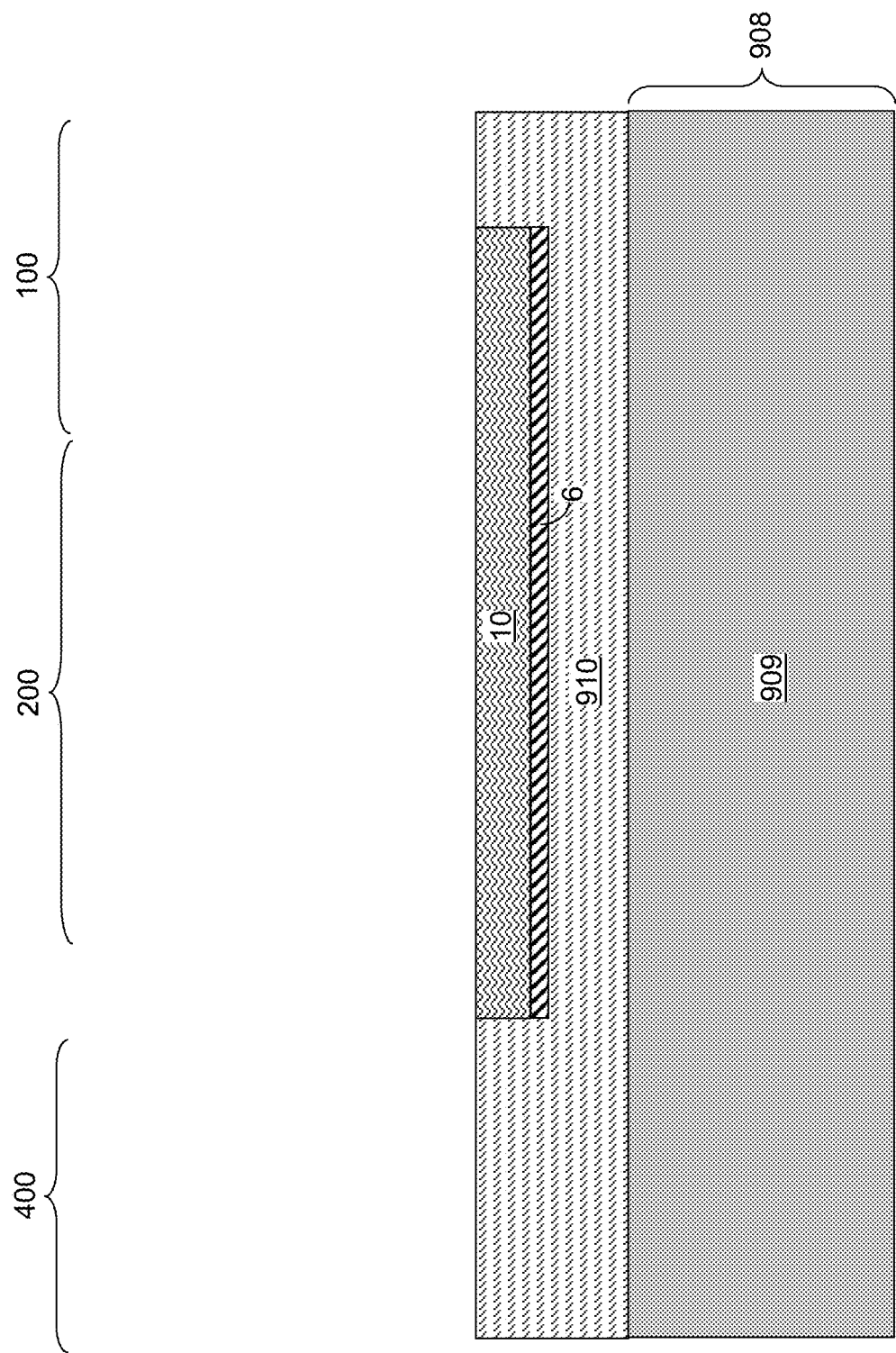
FIG. 1 is a vertical cross-sectional view of an exemplary structure after formation of a source-side dielectric material layer and a doped semiconductor layer on a semiconductor substrate according to an embodiment of the present disclosure.

As discussed above, the present disclosure is directed to a memory die including a through-memory-level via structure formed at the same time as a trench fill structure (e.g., source line or source electrode) and methods for making the same, the various embodiments of which are discussed herein. Embodiments of the present disclosure may be used to provide a three-dimensional array of memory elements such as a three-dimensional NAND memory array.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to an embodiment of the present disclosure is illustrated, which includes an in-process memory die. As used herein, a memory die is a semiconductor die including an array of memory elements. As such, an in-process memory die is a structure that is subsequently modified to form a memory die.

The first exemplary structure may include a substrate 908, which includes a substrate material layer 909, which may be a silicon wafer or a silicon on insulator substrate in one embodiment. The substrate 908 is also referred to as a memory-die substrate because the substrate 908 is subsequently incorporated into a memory die. The substrate material layer 909 may comprise part of the substrate 908 or it may comprise the entire substrate 908. For example, the substrate material layer 909 may comprise a commercially available semiconductor wafer such as a single crystalline silicon wafer.

An optional structure 910 may be formed in or on top of the substrate material layer 909. In one embodiment, the structure 910 may be doped semiconductor well, such as a p-type doped well in a top surface of the substrate material layer 909. In another embodiment, the structure 910 may be a doped epitaxial semiconductor layer, such as a p-type semiconductor layer. In yet another embodiment, the structure 910 may be source-side dielectric material layer formed over the substrate material layer 909 or source-side dielectric isolation regions formed in the top surface of the substrate material layer 909. For brevity, the structure 910 will be described below as a source-side dielectric material layer 910. The source-side dielectric material layer 910 may include a dielectric material such as silicon oxide. The maximum thickness of the source-side dielectric material layer 910 may be in a range from 200 nm to 3,000 nm, although lesser and greater thicknesses may also be used.

However, it should be understood that the other above described materials may be used for the structure 910.

An optional metallic plate layer 6 and an optional semiconductor material layer 10 may be formed in or on the optional structure 910, such as in the source-side dielectric material layer 910. The optional metallic plate layer 6, if present, provides a high conductivity conduction path for electrical current that flows into, along, and/or out of, the optional semiconductor material layer 10. The optional metallic plate layer 6 includes a conductive material such as a metal or a heavily doped semiconductor material. The optional metallic plate layer 6, for example, may include a tungsten layer having a thickness in a range from 3 nm to 100 nm, although lesser and greater thicknesses may also be used. A metal nitride layer (not shown) may be provided as a diffusion barrier layer on top of the metallic plate layer 6. The metallic plate layer 6 may function as a component of a source line in a completed die. The thickness of the metallic plate layer 6 may be in a range from 20 nm to 200 nm, although lesser and greater thicknesses may also be used.

The semiconductor material layer 10 may be a doped semiconductor layer having a doping of the opposite conductivity type of the conductivity type of vertical semiconductor channels to be subsequently formed. For example, if vertical semiconductor channels to be subsequently formed have a doping of a first conductivity type, the semiconductor material layer 10 may have a doping of a second conductivity type that is the opposite of the first conductivity type. For example, if the first conductivity type is p-type, the second conductivity type is n-type, and vice versa. The atomic concentration of second conductivity type dopants in the semiconductor material layer 10 may be in a range from $5.0 \times 10^{19}/cm^3$ to $2.0 \times 10^{21}/cm^3$, although lesser and greater atomic concentrations may also be used. The thickness of the semiconductor material layer 10 may be in a range from 100 nm to 600 nm, although lesser and greater thicknesses may also be used.

The semiconductor material layer 10 and the metallic plate layer 6 may be patterned such that the semiconductor material layer 10 and the metallic plate layer 6 extend over at least a portion of a memory array region 100 in which memory stack structures are to be subsequently formed and over a staircase region 200 in which stepped surfaces of electrically conductive layers embodying word lines are to be subsequently formed. A via interconnection region 400 may be provided around the memory array region 100 and the staircase region 200. In one embodiment, the top surface of the semiconductor material layer 10 may be coplanar with the top surface of the source-side dielectric material layer 910.

Figure 2:
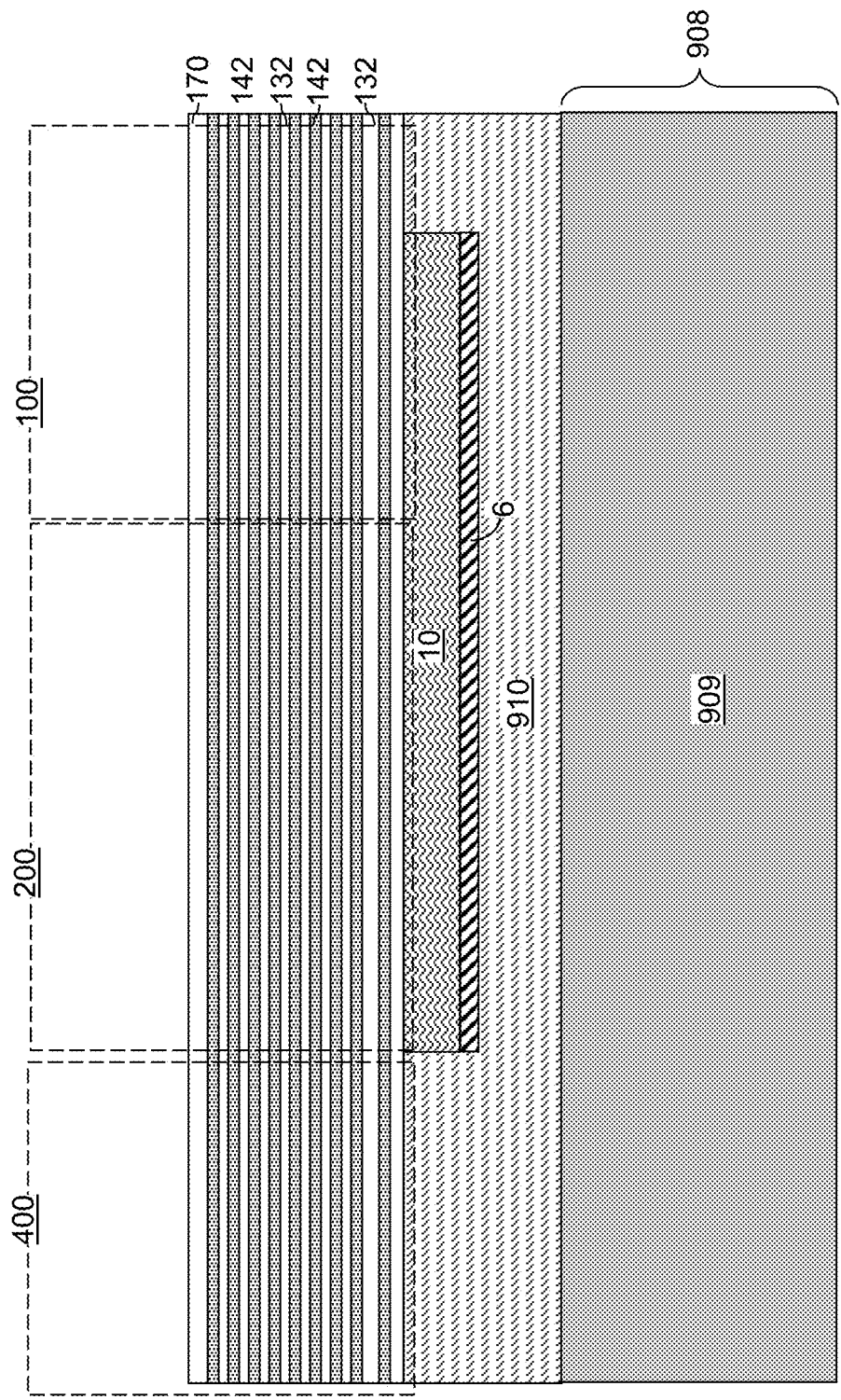
FIG. 2 is a vertical cross-sectional view of the exemplary structure after formation of a first-tier alternating stack of first insulating layers and first spacer material layers according to an embodiment of the present disclosure.

Referring to FIG. 2, an alternating stack of first material layers and second material layers is subsequently formed. Each first material layer may include a first material, and each second material layer may include a second material that is different from the first material. In embodiments where at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the substrate 908, such as over the optional semiconductor material layer 10, if present. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
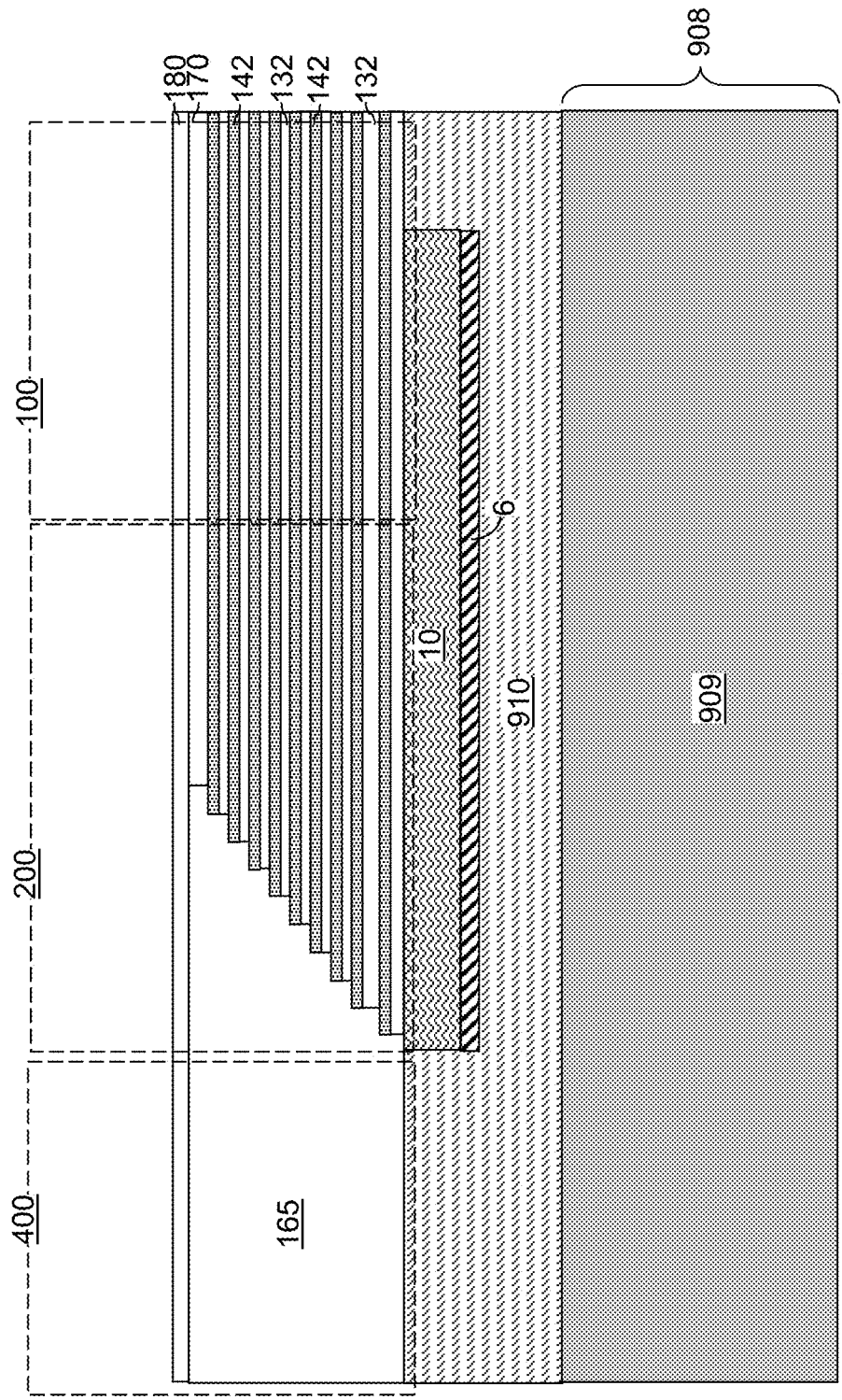
FIG. 3 is a vertical cross-sectional view of the exemplary structure after patterning a first-tier staircase region, a first stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first-tier alternating stack (132, 142) and the first stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
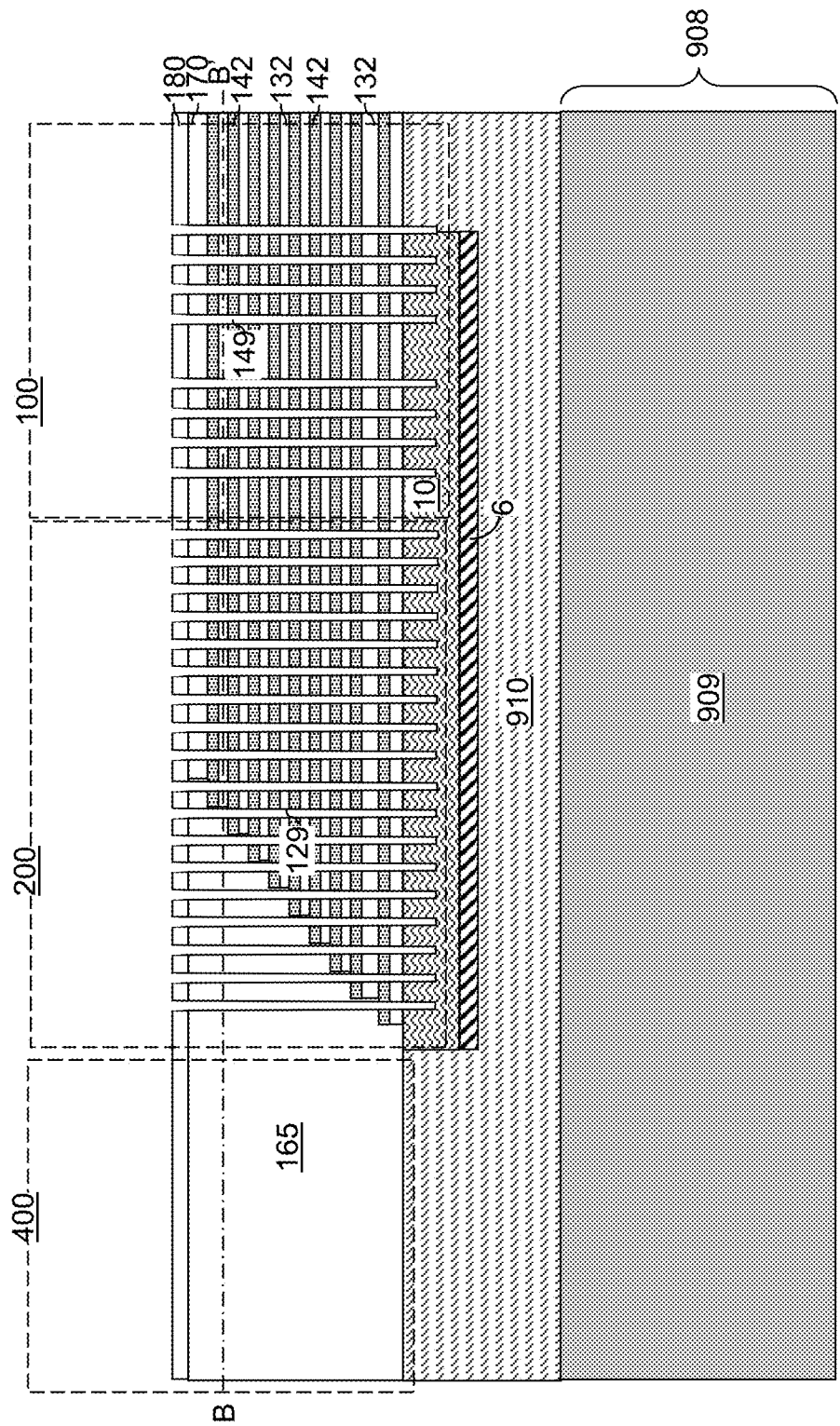
FIG. 4A is a vertical cross-sectional view of the exemplary structure after formation of first-tier memory openings and first-tier support openings according to an embodiment of the present disclosure.
Figure 4B:
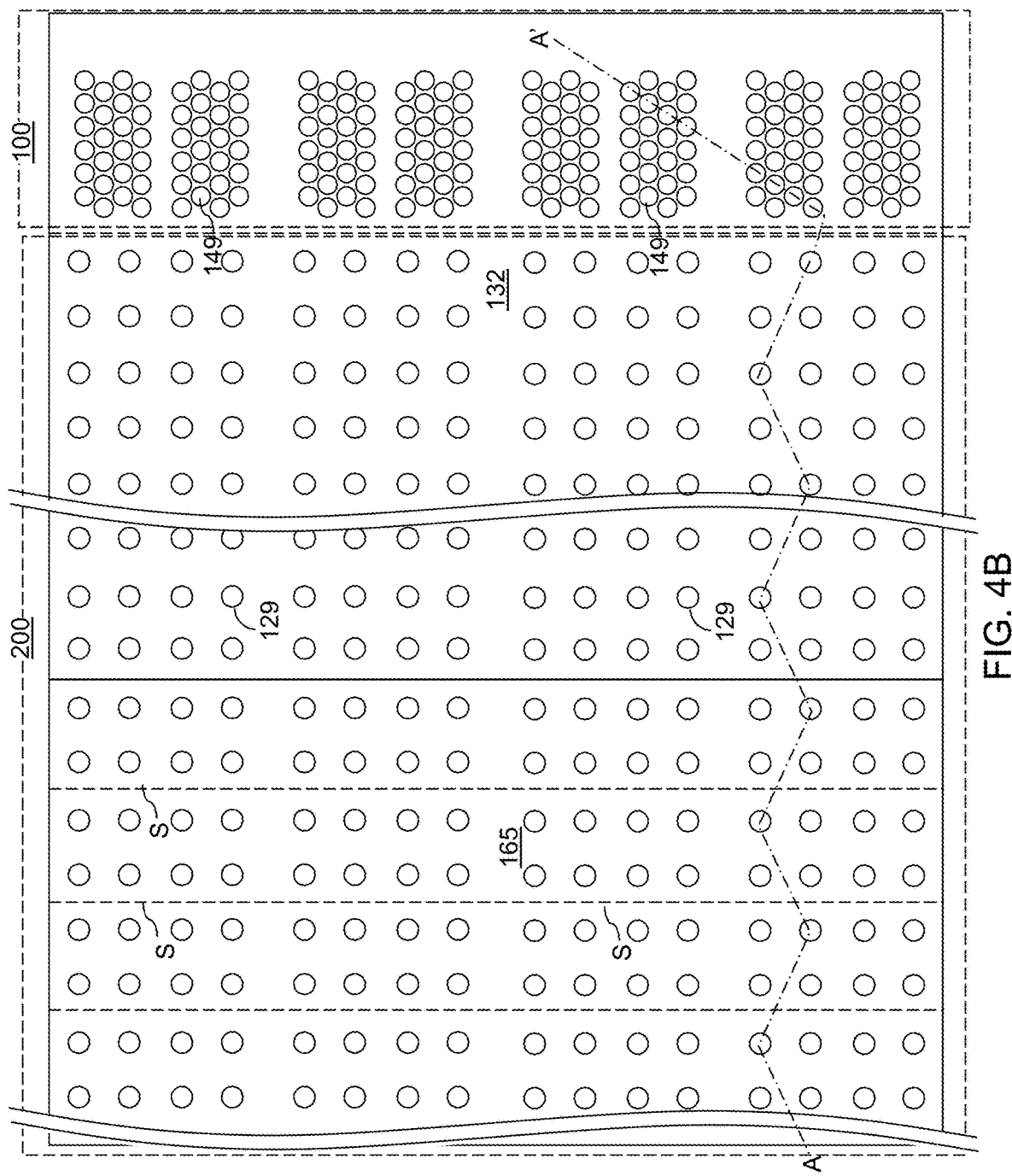
FIG. 4B is a horizontal cross-sectional view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the semiconductor material layer 10. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the semiconductor material layer 10 by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that may be formed in the memory array region 100 through each layer within the first alternating stack (132, 142) and may be subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 may be openings that are formed in the staircase region 200. A subset of the first-tier support openings 129 that is formed through the first stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first stepped dielectric material portion 165. The chemistry of the initial etch step may alternate to optimize etching of the first and second materials in the first-tier alternating stack (132, 142) while providing a comparable average etch rate to the material of the first stepped dielectric material portion 165. The first anisotropic etch process may use, for example, a series of reactive ion etch processes or a single reaction etch process (e.g., $CF_4$/

$O_2$/Ar etch). The sidewalls of the various first-tier openings (149, 129) may be substantially vertical, or may be tapered. In one embodiment, the terminal portion of the anisotropic etch process may include an overetch step that etches into an upper portion of the semiconductor material layer 10. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
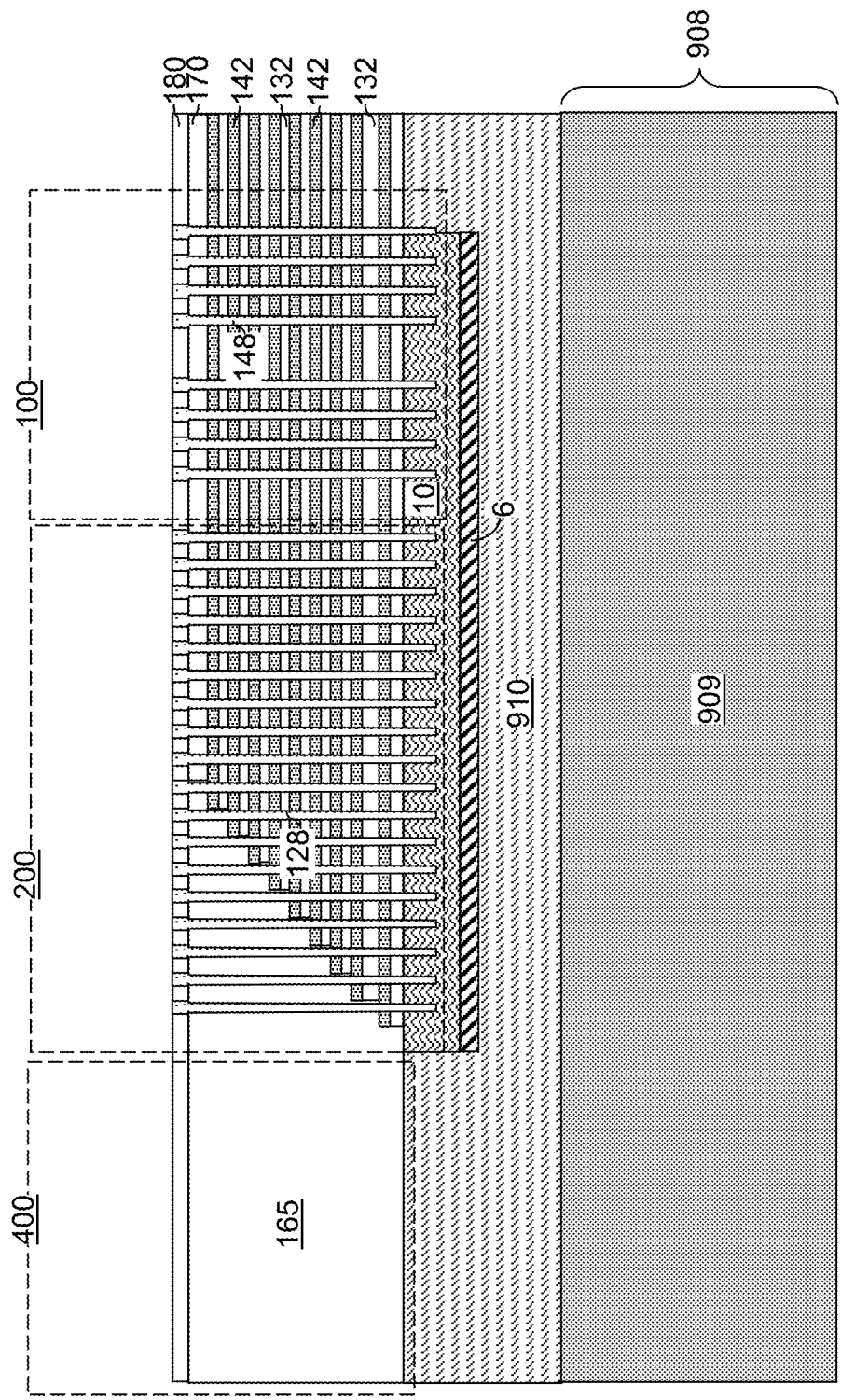
FIG. 5 is a vertical cross-sectional view of the exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) may be concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
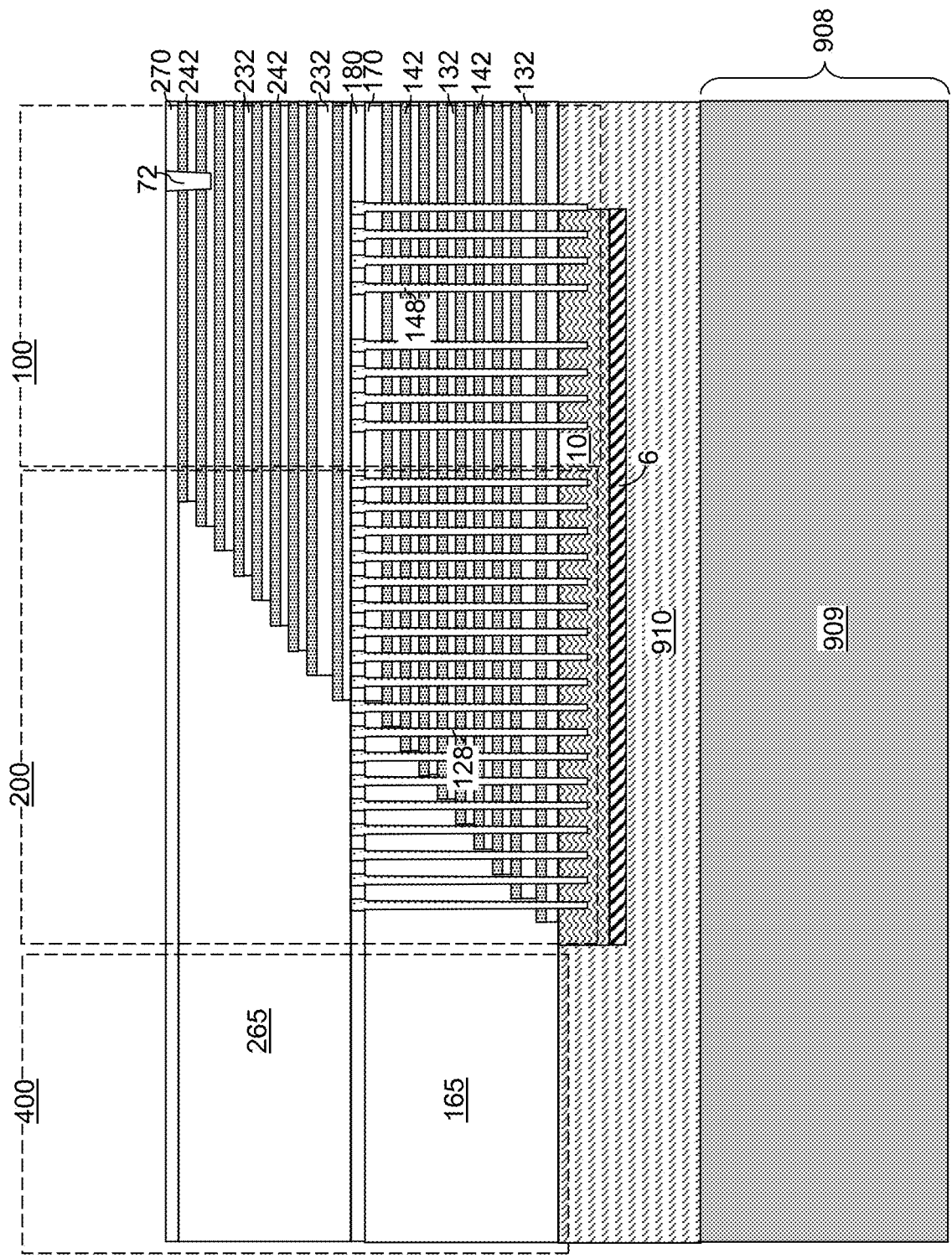
FIG. 6 is a vertical cross-sectional view of the exemplary structure after formation of a second-tier alternating stack of second insulating layers and second spacer material layers, second stepped surfaces, and a second stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) may include an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the semiconductor material layer 10, and at least one stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers may be subsequently formed. The drain-select-level isolation structures 72 may include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second stepped dielectric material portion 265, the second insulating cap layer 270, and the optional drain-select-level isolation structures 72 collectively constitute a second-tier structure (232, 242, 265, 270, 72).

Figure 7A:
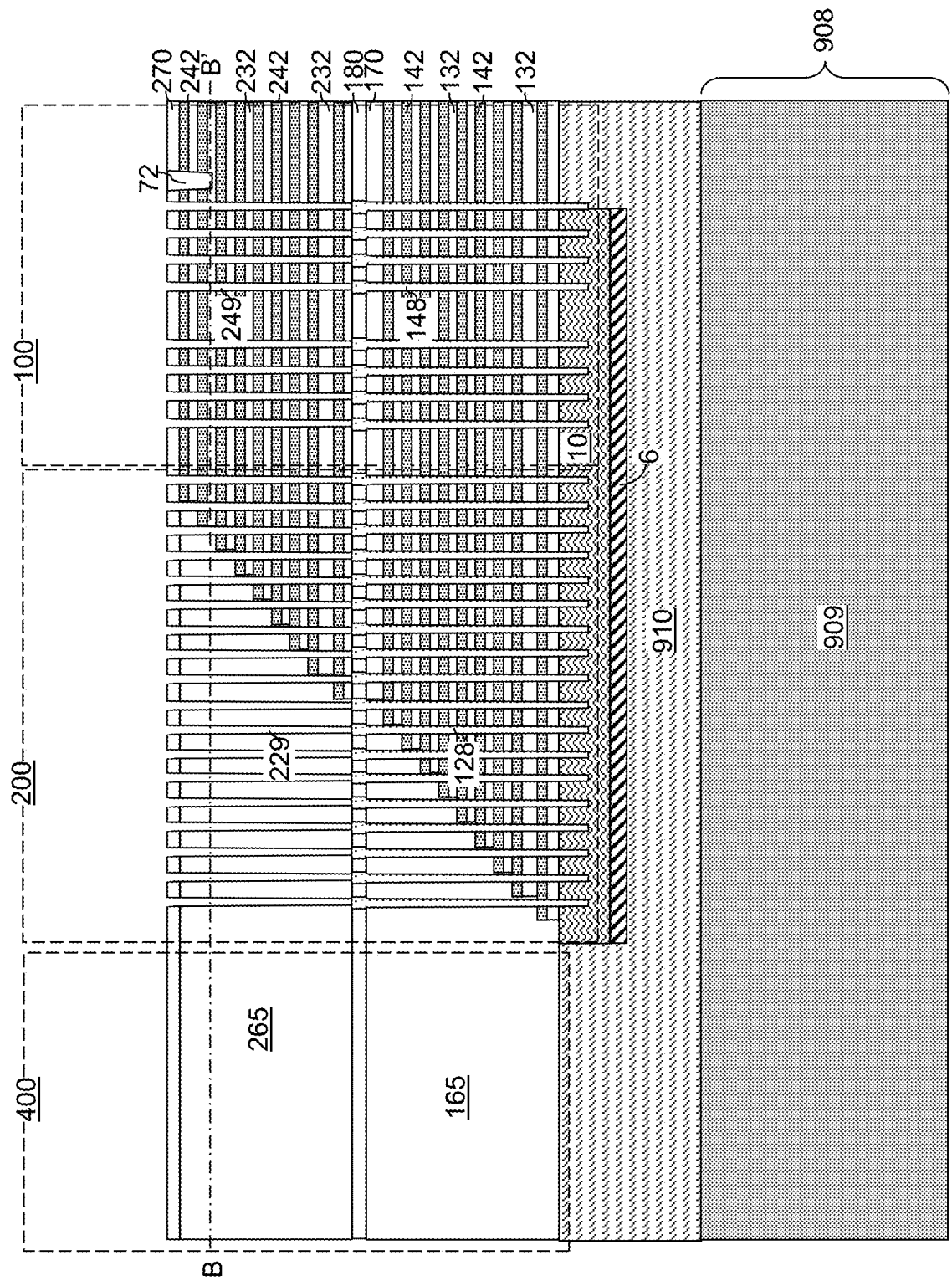
FIG. 7A is a vertical cross-sectional view of the exemplary structure after formation of second-tier memory openings and second-tier support openings according to an embodiment of the present disclosure.
Figure 7B:
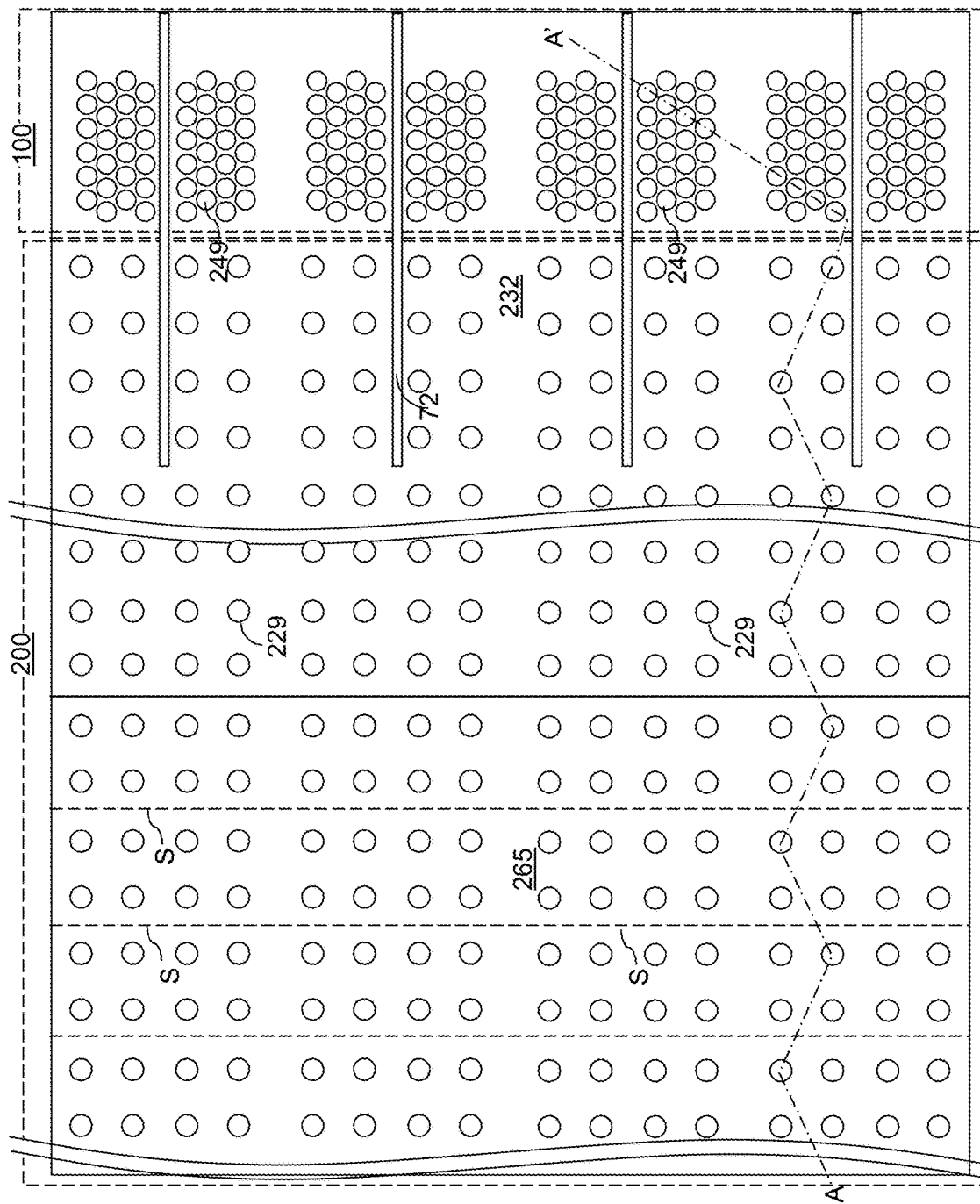
FIG. 7B is a horizontal cross-sectional of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second stepped dielectric material portion 265. The chemistry of the etch step may alternate to optimize etching of the materials in the second-tier alternating stack (232, 242) while providing a comparable average etch rate to the material of the second stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
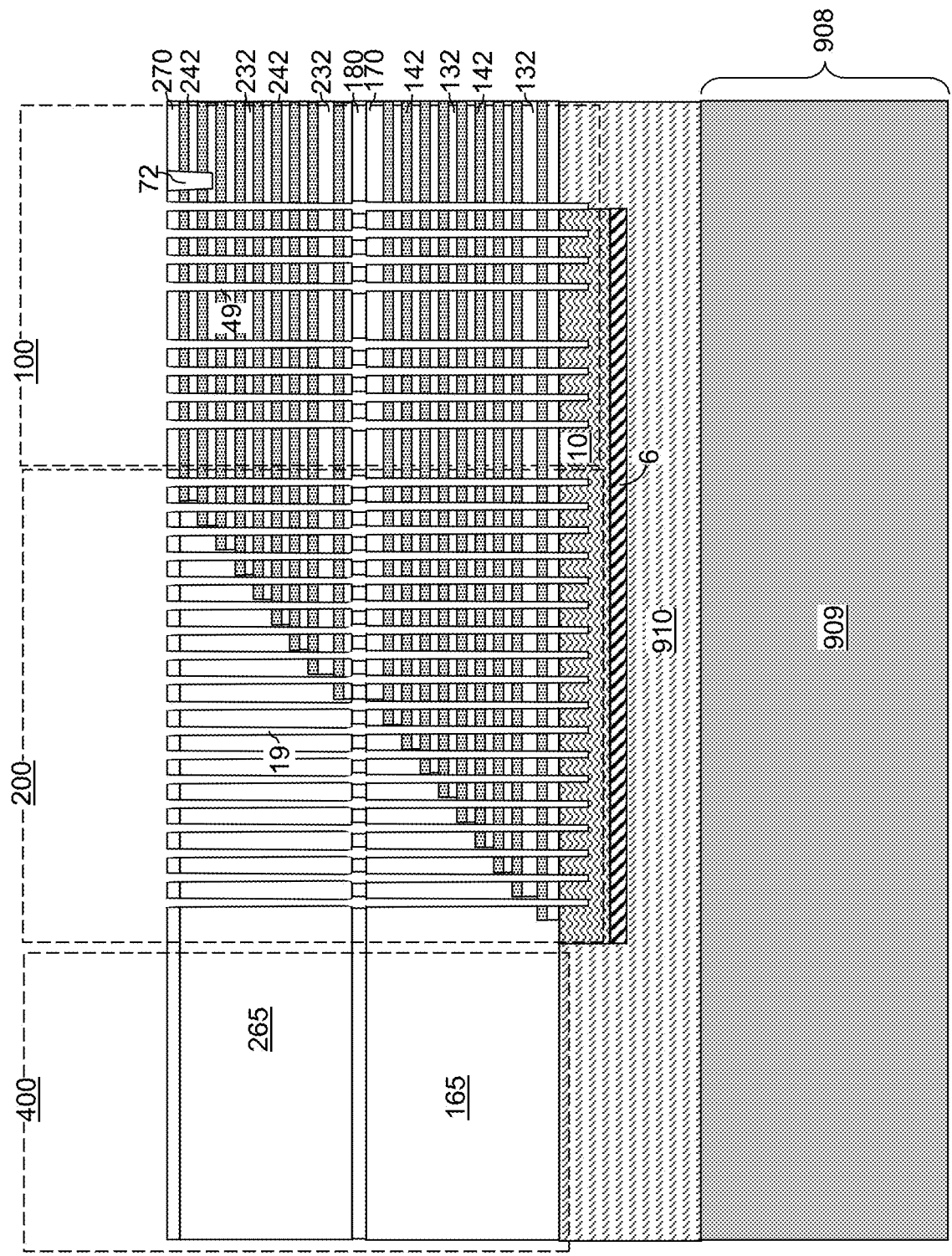
FIG. 8 is a vertical cross-sectional view of the exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Referring to FIG. 9A, a pedestal channel portion 11 may be formed by a selective semiconductor material deposition process at the bottom of each memory opening 49 and at the bottom of each support opening 19. A doped semiconductor material having a doping of a first conductivity type may be selectively grown from the physically exposed surfaces of the semiconductor material layer 10, while growth of the doped semiconductor material from dielectric surfaces is suppressed during the selective semiconductor material deposition process. A semiconductor precursor gas, a dopant gas including dopants atoms of the first conductivity type, and an etchant may be flowed into a process chamber including the exemplary structure concurrently or alternately. A periphery of a top surface each pedestal channel portion 11 may contact a sidewall of a first insulating layer 132 that overlies, and contacts, a bottommost first sacrificial material layer 142. The atomic concentration of first conductivity type dopants in the pedestal channel portions 11 may be in a range from $1.0 \times 1014/cm^3$ to $1.0 \times 1018/cm^3$, although lesser and greater dopant atomic concentrations may also be used. A p-n junction may be formed at each interface between the semiconductor material layer 10 and the pedestal channel portions 11.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively, or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{15}/cm^3$ to $1.0 \times 10^{19}/cm^3$, such as from $1.0 \times 10^{16}/cm^3$ to $1.0 \times 10^{18}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Figure 9D:
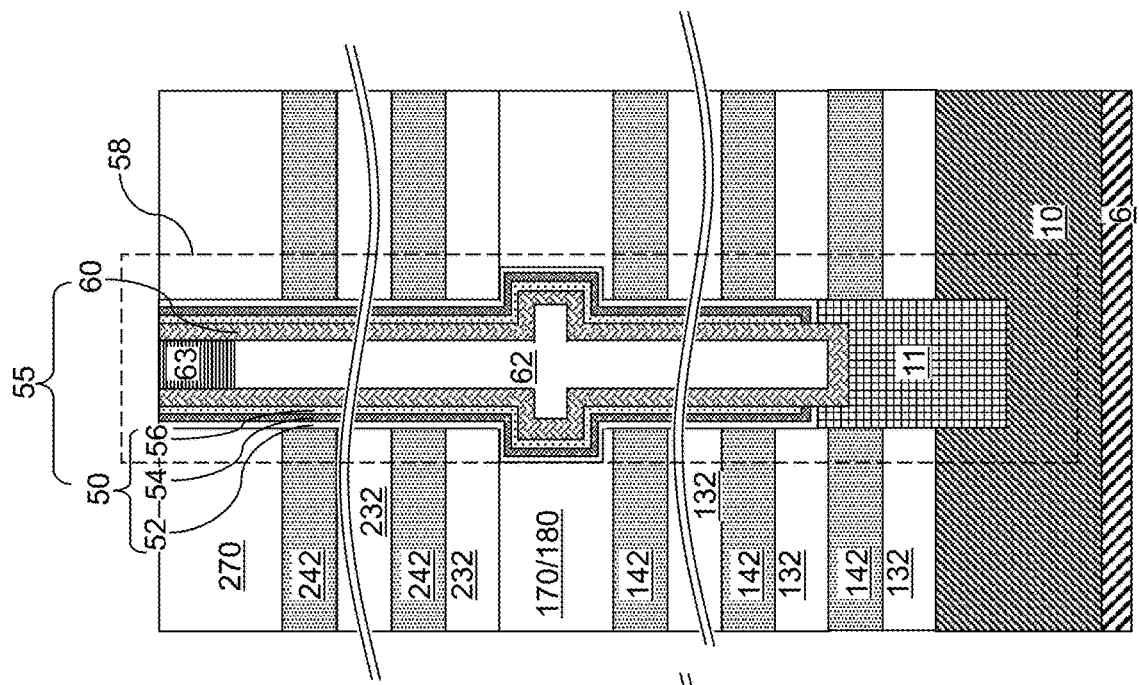
Figure 9C:
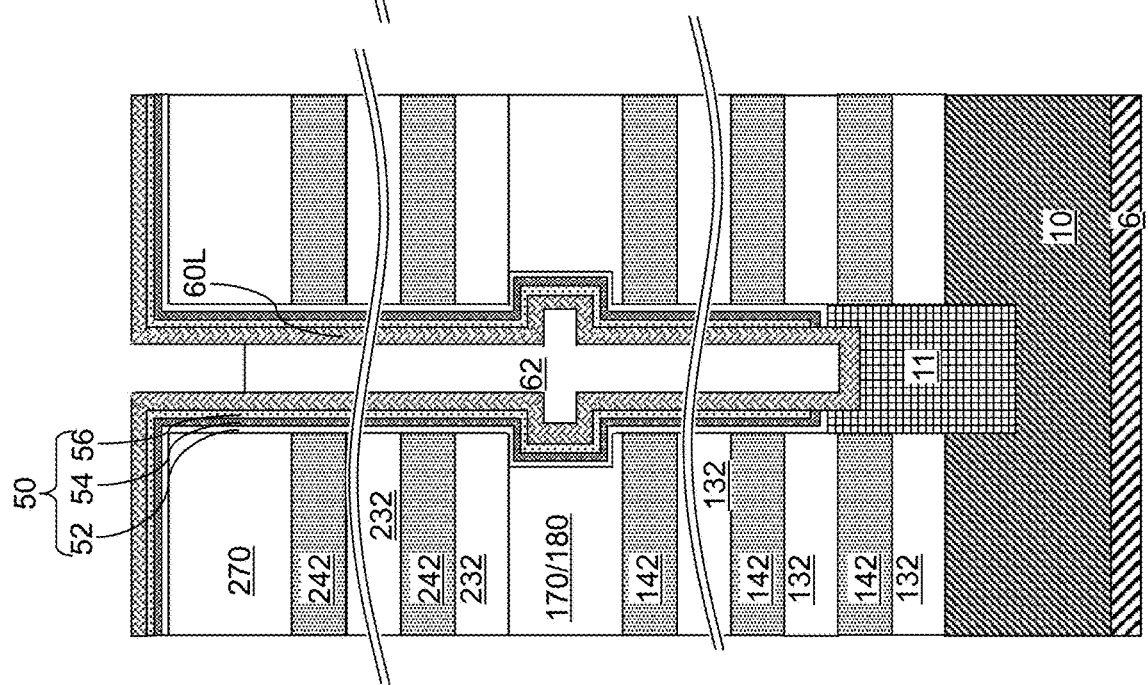

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer may include a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material may be deposited in cavities overlying the dielectric cores 62. The doped semiconductor material has a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the n-doped semiconductor material constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 is not present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The semiconductor material layer 10, the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
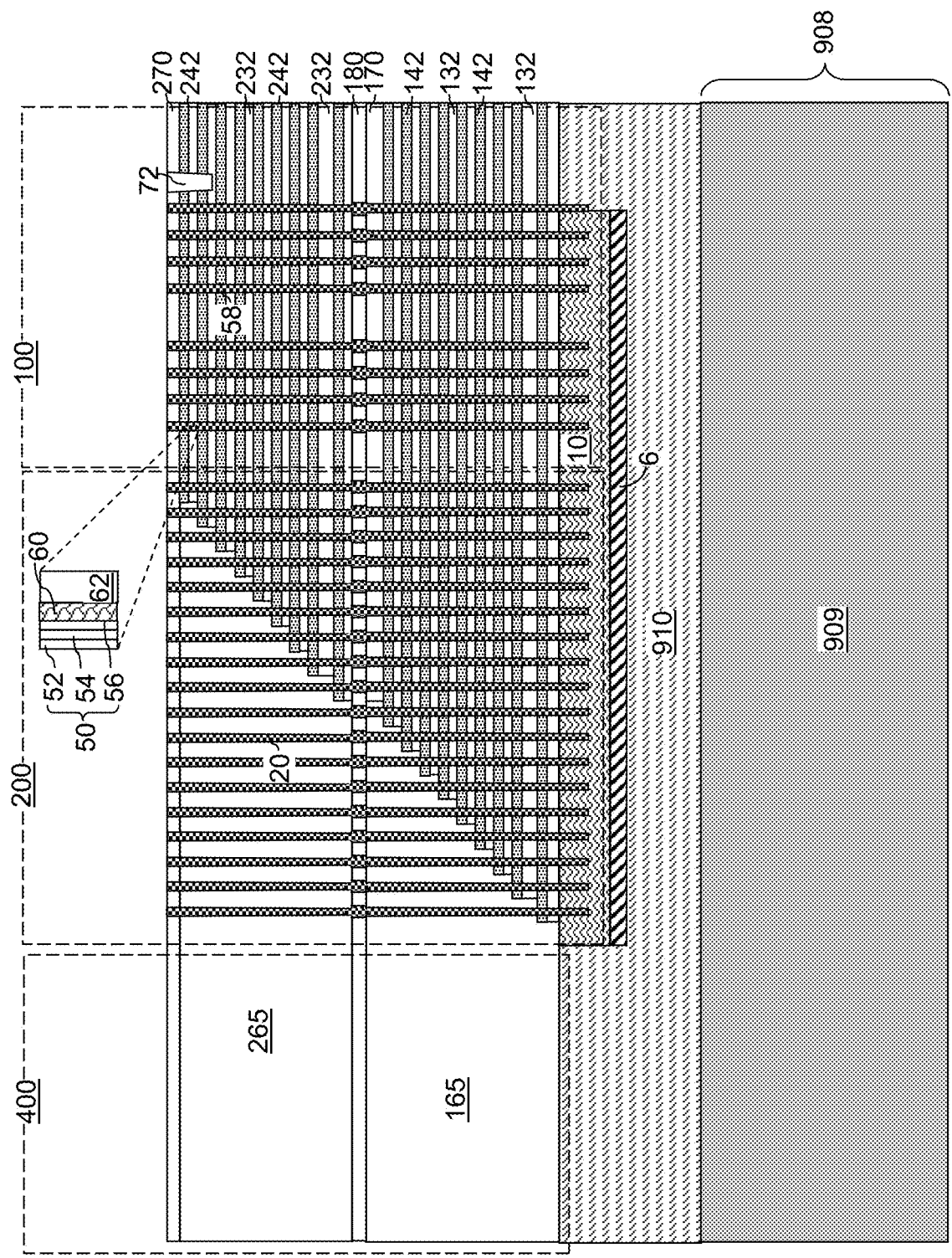
FIG. 10 is a vertical cross-sectional view of the exemplary structure after formation of memory opening fill structures and support pillar structures according to an embodiment of the present disclosure.

Referring to FIG. 10, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 11A:
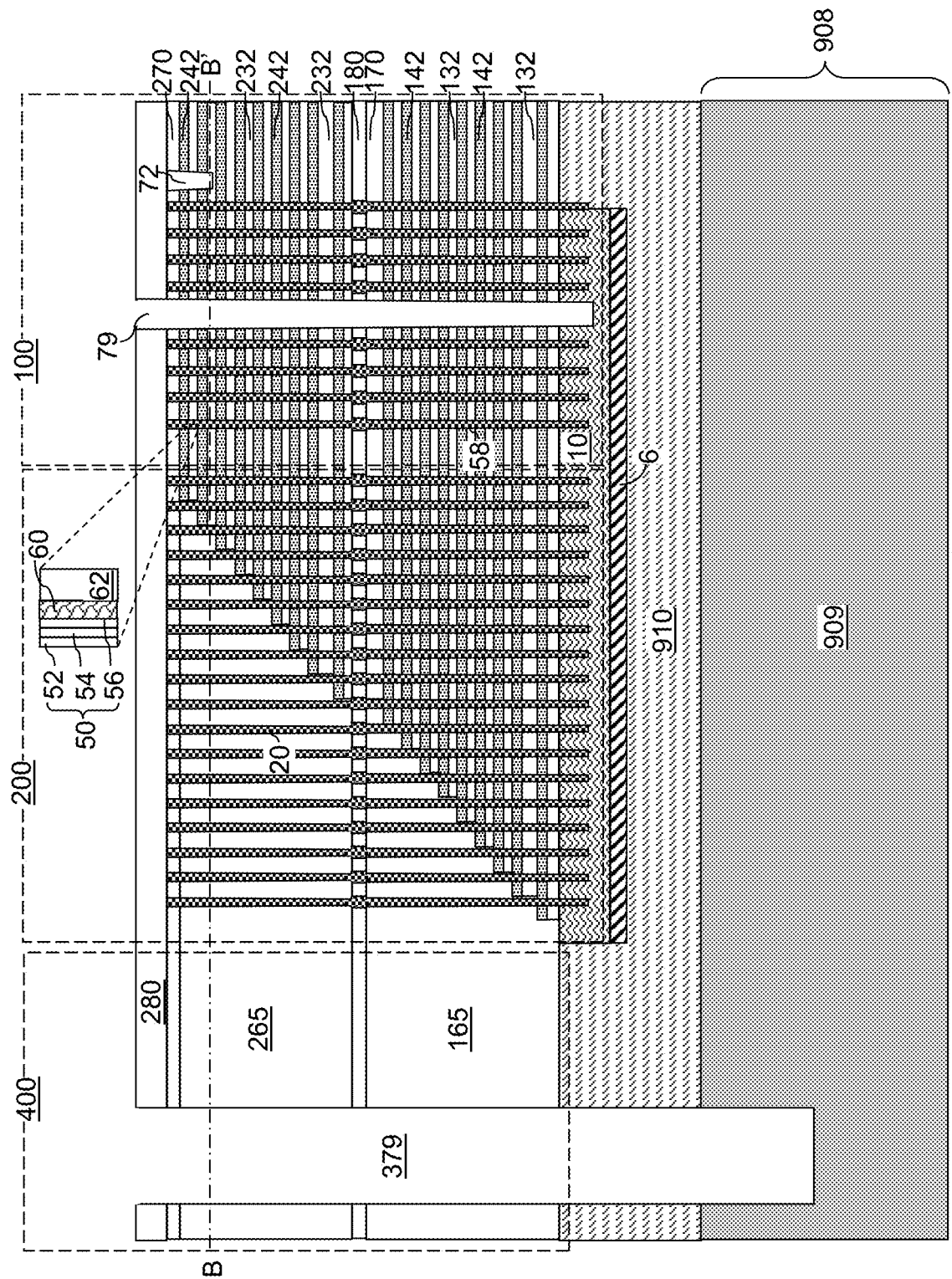
FIG. 11A is a vertical cross-sectional view of the exemplary structure after formation of a first contact-level dielectric layer, backside trenches, and via cavities according to an embodiment of the present disclosure.
Figure 11B:
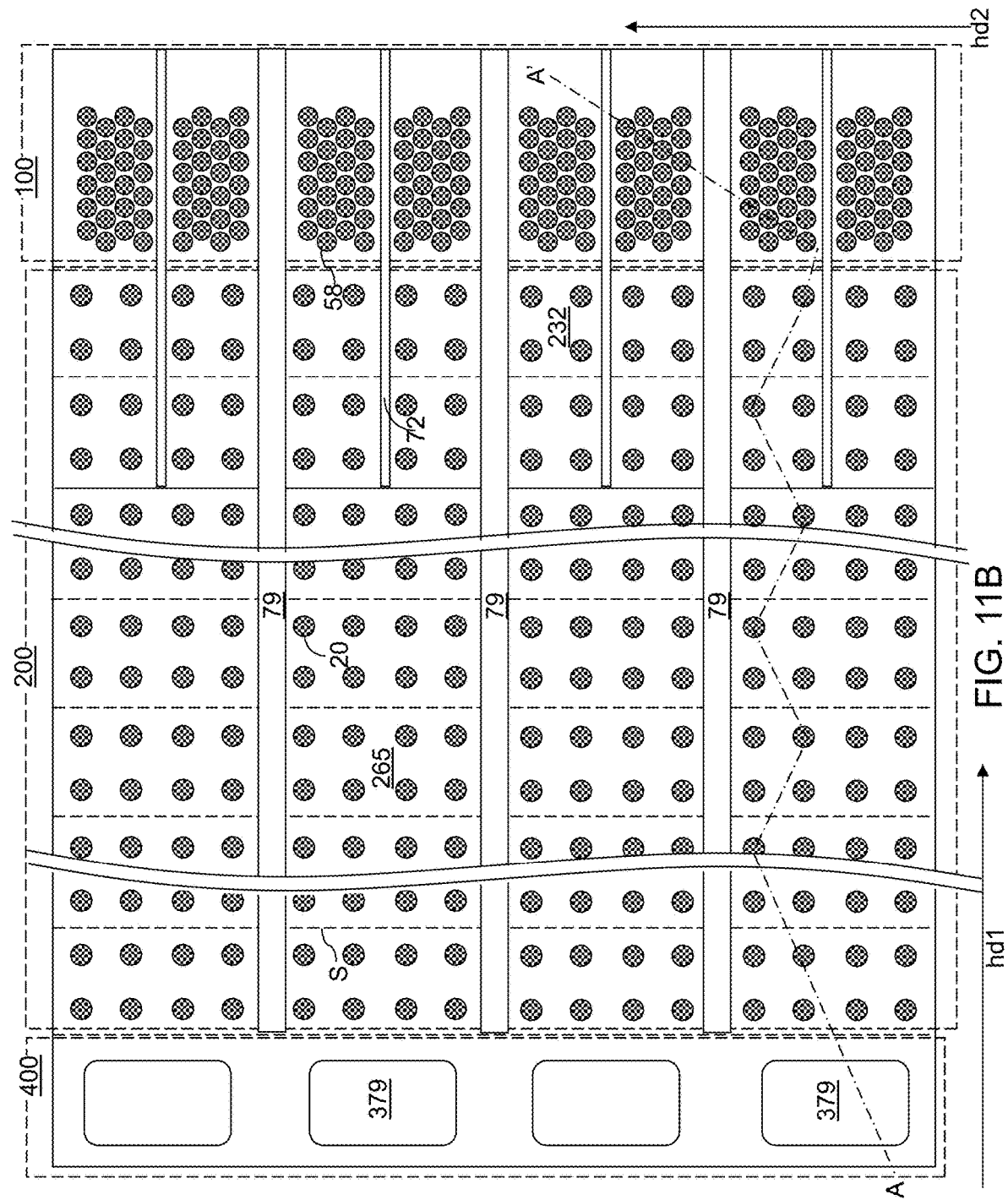
FIG. 11B is a horizontal cross-sectional of the exemplary structure along the horizontal plane B-B' of FIG. 11A. The hinged vertical plane A-A' corresponds to the plane of the vertical cross-sectional view of FIG. 11A.

Referring to FIGS. 11A and 11B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280 and may be lithographically patterned to form discrete openings and elongated openings. The discrete openings through the photoresist layer may be formed in the via interconnection region 400, and may have circular shapes, oval shapes, polygonal shapes, or rounded polygonal shapes. The elongated openings may include rectangular openings formed in the memory array region 100 and the staircase region 200. The elongated opening may laterally extend along the first horizontal direction hd1 between clusters of memory opening fill structures 58.

An anisotropic etch is performed to transfer the pattern of the discrete openings and the elongated openings through underlying material portions. Backside trenches 79 may be formed by transferring the pattern in the photoresist layer through the first contact-level dielectric layer 280, the second-tier structure (232, 242, 270, 265, 72), and the first-tier structure (132, 142, 170, 165), and into the semiconductor material layer 10. Portions of the first contact-level dielectric layer 280, the second-tier structure (232, 242, 270, 265, 72), the first-tier structure (132, 142, 170, 165), and the semiconductor material layer 10 that underlie the openings in the photoresist layer may be removed to form the backside trenches 79. The anisotropic etch process may be selective to the material of the semiconductor material layer 10 so that the backside trenches 79 do not etch through the semiconductor material layer 10. In one embodiment, the backside trenches 79 may be formed between clusters of memory stack structures 55. The clusters of the memory stack structures 55 may be laterally spaced apart along the second horizontal direction hd2 by the backside trenches 79.

The anisotropic etch process transfers the pattern of the discrete openings in the photoresist layer through the first contact-level dielectric layer 280, the second insulating cap layer 270, the second retro-stepped dielectric material portion 265, the inter-tier dielectric layer 180, the first retro-stepped dielectric material portion 165, and the optional structure 910, such as the source-side dielectric material layer 910, and into an upper portion of the substrate material layer 909. A via cavity 379 may be formed underneath each discrete opening in the photoresist layer within the via interconnection region 400.

The lateral dimensions of the discrete openings and the elongated openings may be selected such that the width of each discrete opening is greater than the width of the elongated openings. Consequently, each of the via cavities 379 may have a greater width than the backside trenches 79. For example, the backside trenches 79 may laterally extend along the first horizontal direction hd1 with a uniform width along the second horizontal direction hd2. The width of the backside trenches 79 along the second horizontal direction may be in a range from 100 nm to 500 nm, and the minimum width of each via cavity 379 may be in a range from 200 nm to 4,000 nm, such as from 400 nm to 2,000 nm, although lesser and greater widths may also be used for each of the backside trenches 79 and the via cavities 379. Generally, minimum width of each via cavity 379 may be at least 1.5 times the width of each backside trench 79, and may be in a range from twice the width of each backside trench 79 to 40 times the width of each backside trench 79. As used herein, a width of a cavity or a trench refers to a distance between a pair of opposing sidewalls that are parallel to each other. Thus, each via cavity 379 may have a minimum width and a maximum width at a same height. In case a via cavity 379 has a circular horizontal cross-sectional shape, the maximum width of the via cavity 379 may be the same as the minimum width of the via cavity 379.

The greater width of the via cavities 379 relative to the width of the backside trenches 79 induce a pattern factor effect during the anisotropic etch process, and causes the via cavities 379 to be etched at a higher etch rate relative to the backside trenches 79. Thus, the via cavities 379 may etch through the retro-stepped dielectric material layer 165 and through the source-side dielectric material layer 910 and into an upper portion of the substrate material layer 909, whereas the backside trenches 79 are formed through the alternating stacks {(132, 142), (232, 242)} and only partly into the substrate material layer 909.

In other words, the via cavities 379 are deeper (i.e., longer) than the backside trenches 79. In an embodiment in which the structure 910 is omitted or comprises a doped well in the substrate material layer 909 (e.g., in a silicon wafer) and the semiconductor material layer 10 and/or metallic plate layer 6 are omitted, the via cavities 379 may extend deeper into the substrate 908 than the backside trenches 79.

Further, the chemistry of the anisotropic etch process may be selected to etch the materials of the second retro-stepped dielectric material portion 265, the first retro-stepped dielectric material portion 165, and the optional source-side dielectric material layer 910 at a higher etch rate than the material of the sacrificial material layers (142, 242).

For example, the insulating layers (132, 232), the second retro-stepped dielectric material portion 265, the first retro-stepped dielectric material portion 165, and the source-side dielectric material layer 910 may include silicon oxide-based materials (such as undoped silicate glass or doped silicate glass materials), and the sacrificial material layers (142, 242) may include silicon nitride. In this case, the chemistry of the anisotropic etch process may be tuned to etch silicon oxide-based materials at a higher etch rate (for example, by a factor in a range from 1.5 to 5) than silicon oxide. Thus, the via cavities 379 and the backside trenches 79 may be formed simultaneously using a same anisotropic etch process such that the via cavities 379 extend into an upper portion of the substrate material layer 909, while the backside trenches 79 have bottom surfaces at the semiconductor material layer 10, and does not extend through the semiconductor material layer 10.

In one embodiment, a semiconductor etch step may be used to etch the material of the semiconductor material layer 10 and to increase the depth of the via cavities 379 before the backside trenches 79 reach the top surface of the semiconductor material layer 10. In this case, the anisotropic etch process may include the semiconductor etch step between a first dielectric material etch step that extends the via cavities 379 to the top surface of the substrate material layer 909 before the backside trenches 79 reach the semiconductor material layer 10, the semiconductor etch step that follows the first dielectric material etch step, and a second dielectric material etch step that follows the semiconductor etch step and extends the backside trenches 79 to the top surface of the semiconductor material layer 10. The second dielectric material etch step may be selective to the semiconductor material of the semiconductor material layer 10. The photoresist layer may be subsequently removed, for example, by ashing.

Generally, the backside trenches 79 may extend through each alternating stack {(132, 142), (232, 242)}, and the via cavities 379 may extend through the at least one dielectric material portion (such as the second retro-stepped dielectric material portion 265 and the first retro-stepped dielectric material portion 165 using a same anisotropic etch process. The backside trenches 79 vertically extends through each of the alternating stacks {(132, 142), (232, 242)}, and has a bottom surface that overlies a top surface of a substrate (i.e., the substrate 908). The via cavities 379 extend through the at least one dielectric material portion and extends into an upper portion of the substrate 908. While the present disclosure uses an embodiment using two alternating stacks {(132, 142), (232, 242)}, embodiments using a single alternating stack or more than two alternating stacks are expressly contemplated herein.

Figure 12:
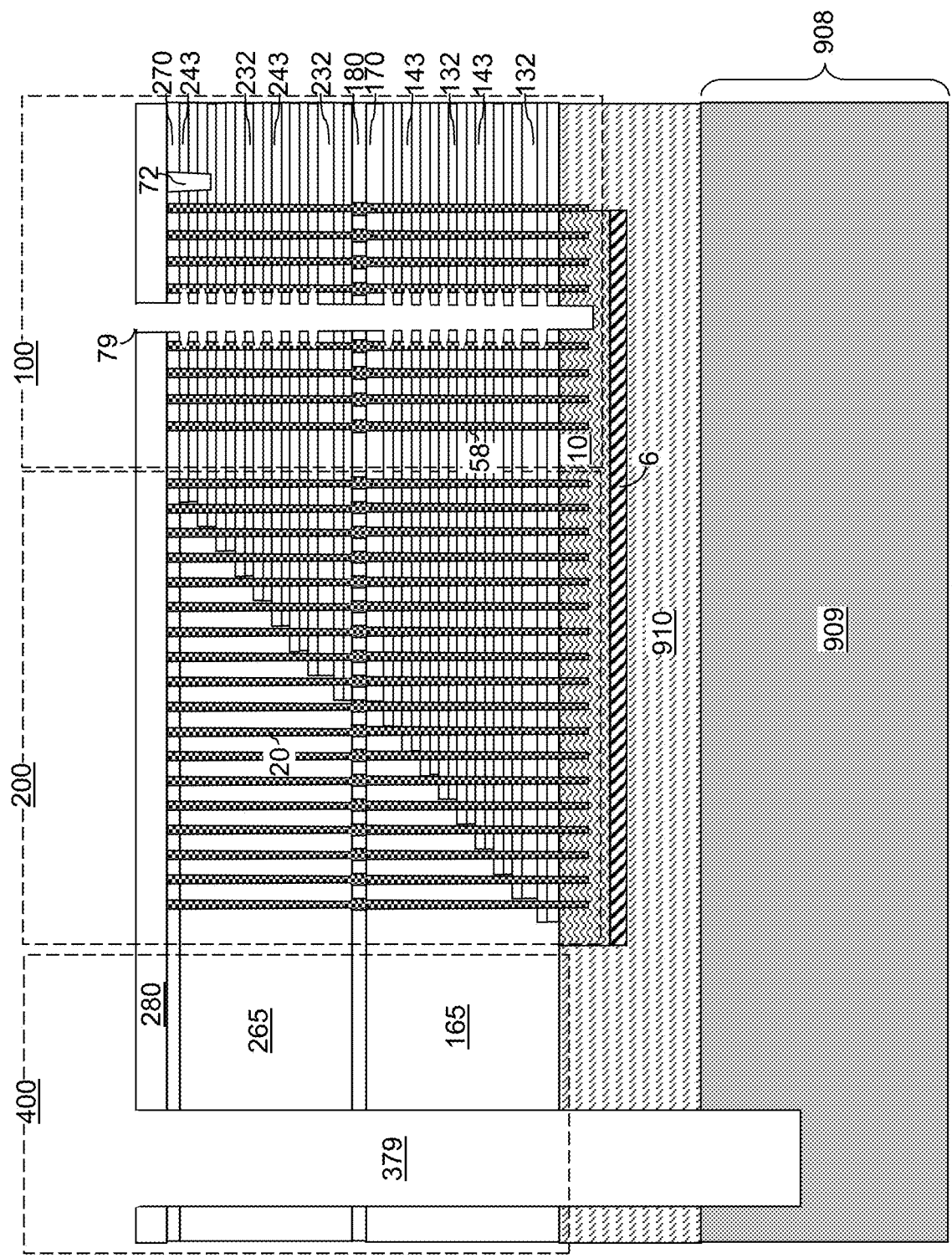
FIG. 12 is a vertical cross-sectional view of the exemplary structure after formation of backside recesses according to an embodiment of the present disclosure.

Referring to FIG. 12, the sacrificial material layers (142, 242) are may be removed selective to the insulating layers (132, 232), the first and second insulating cap layers (170, 270), the first contact-level dielectric layer 280, the semiconductor material layer 10, the source-side dielectric material layer 910, and the substrate material layer 909. For example, an etchant that selectively etches the materials of the sacrificial material layers (142, 242) with respect to the materials of the insulating layers (132, 232), the first and second insulating cap layers (170, 270), the stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the stepped dielectric material portions (165, 265), the source-side dielectric material layer 910, and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate material layer 909. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 13A:
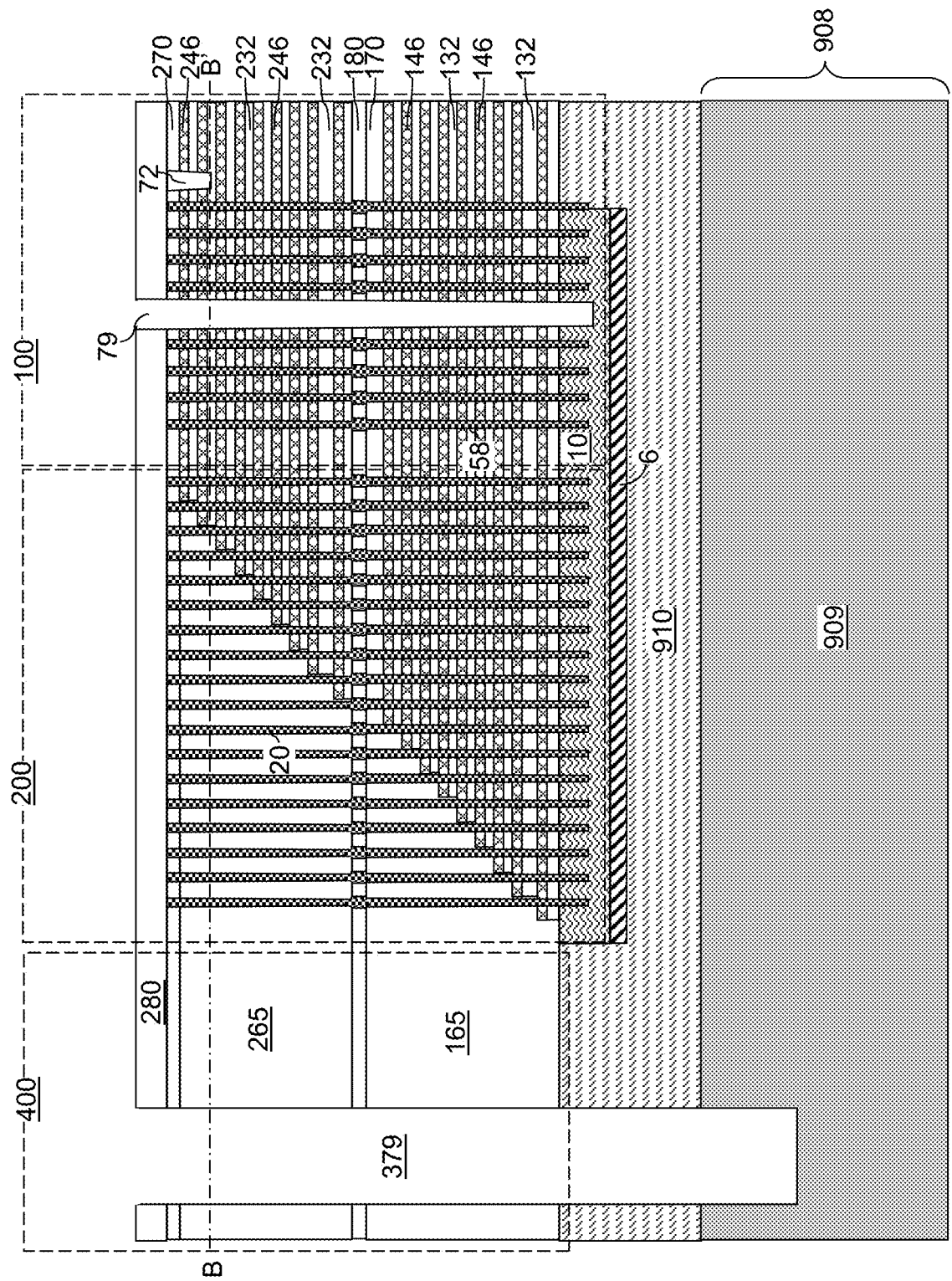
FIG. 13A is a vertical cross-sectional view of the exemplary structure after formation of electrically conductive layers according to an embodiment of the present disclosure.
Figure 13B:
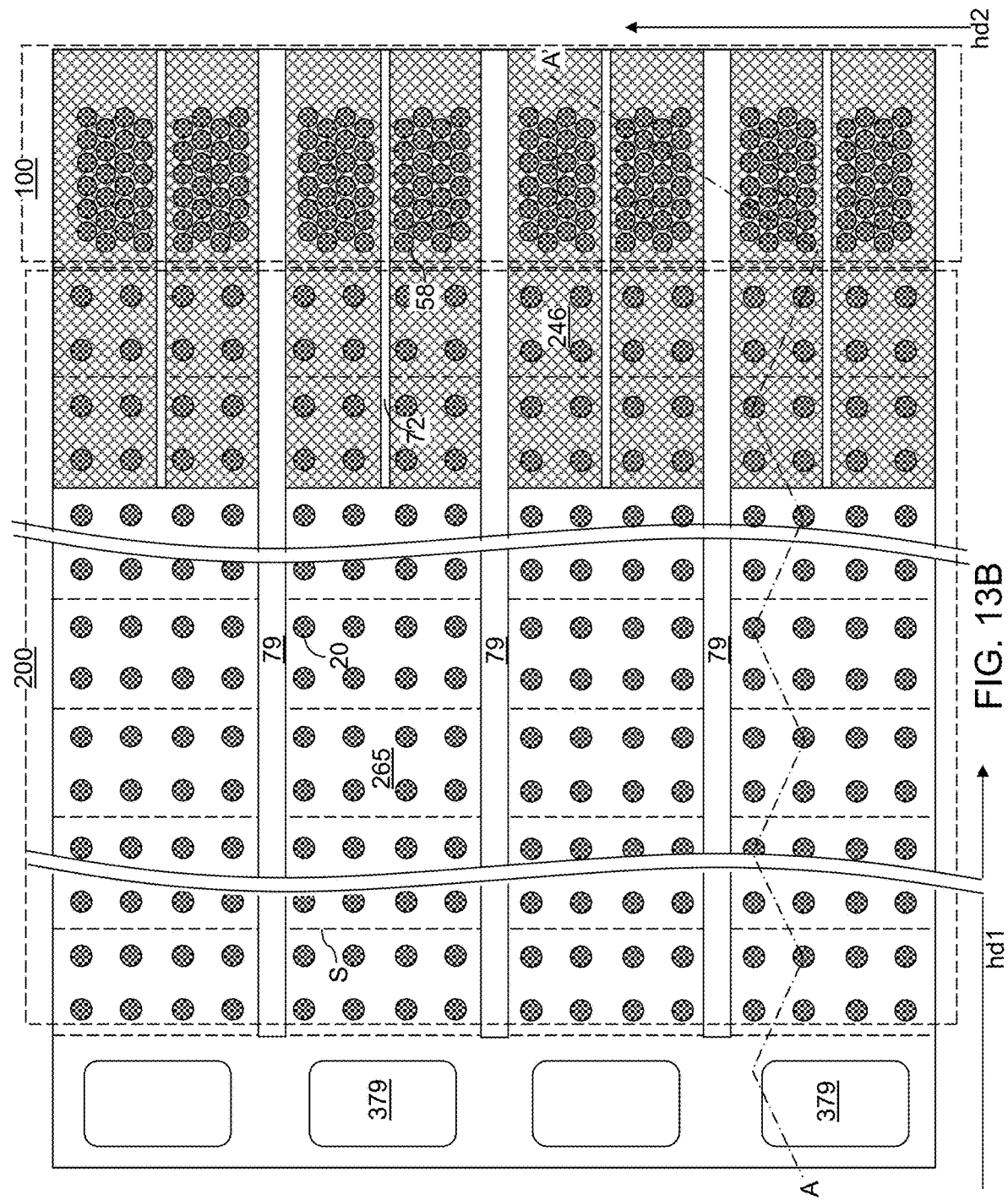
FIG. 13B is a horizontal cross-sectional of the exemplary structure along the horizontal plane B-B' of FIG. 13A. The hinged vertical plane A-A' corresponds to the plane of the vertical cross-sectional view of FIG. 13A.

Referring to FIGS. 13A and 13B, an oxidation process may be performed to oxidize physically exposed portions of the pedestal channel portions 11. Tubular insulating spacers (not expressly illustrated) may be formed around each pedestal channel portion 11. A backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying via interconnection region 400 may comprise word line switch devices configured to control a bias voltage to respective word lines. The memory-level assembly is located over the substrate material layer 909. The memory-level assembly includes at least one alternating stack (132, 146, 232, 246) and memory stack structures 55 vertically extending through the at least one alternating stack (132, 146, 232, 246).

The sacrificial material layers (142, 242) are replaced with electrically conductive layers (146, 246) by using the backside trenches as conduits for providing an etchant for the sacrificial material layers (142, 242) and for providing a reactant for forming the electrically conductive material layers (146, 246) in the backside recesses (143, 242), i.e., in volumes from which the sacrificial material layers (142, 242) are removed.

Figure 14A:
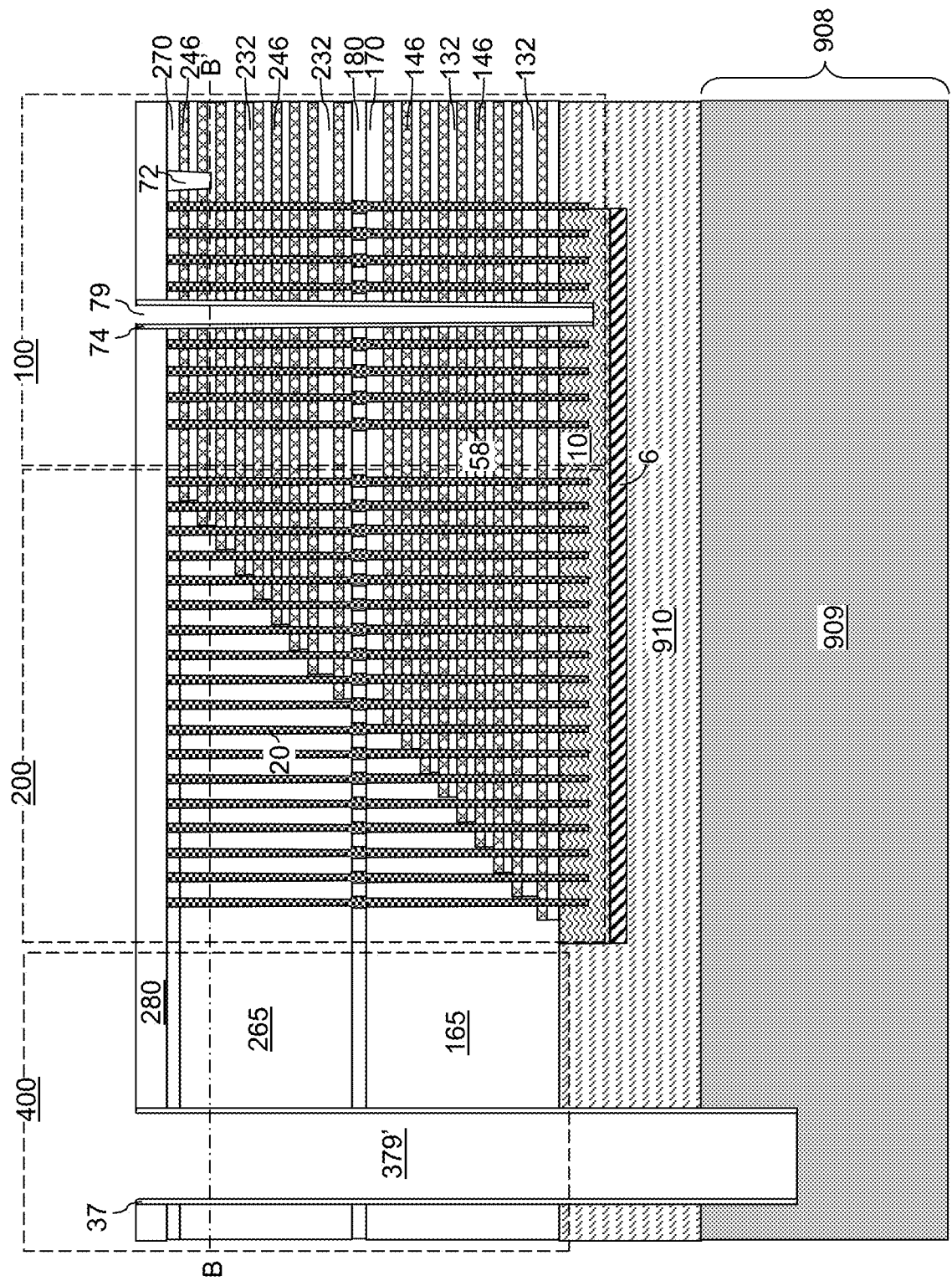
FIG. 14A is a vertical cross-sectional view of the exemplary structure after formation of trench insulating spacers and insulating via liners according to an embodiment of the present disclosure.
Figure 14B:
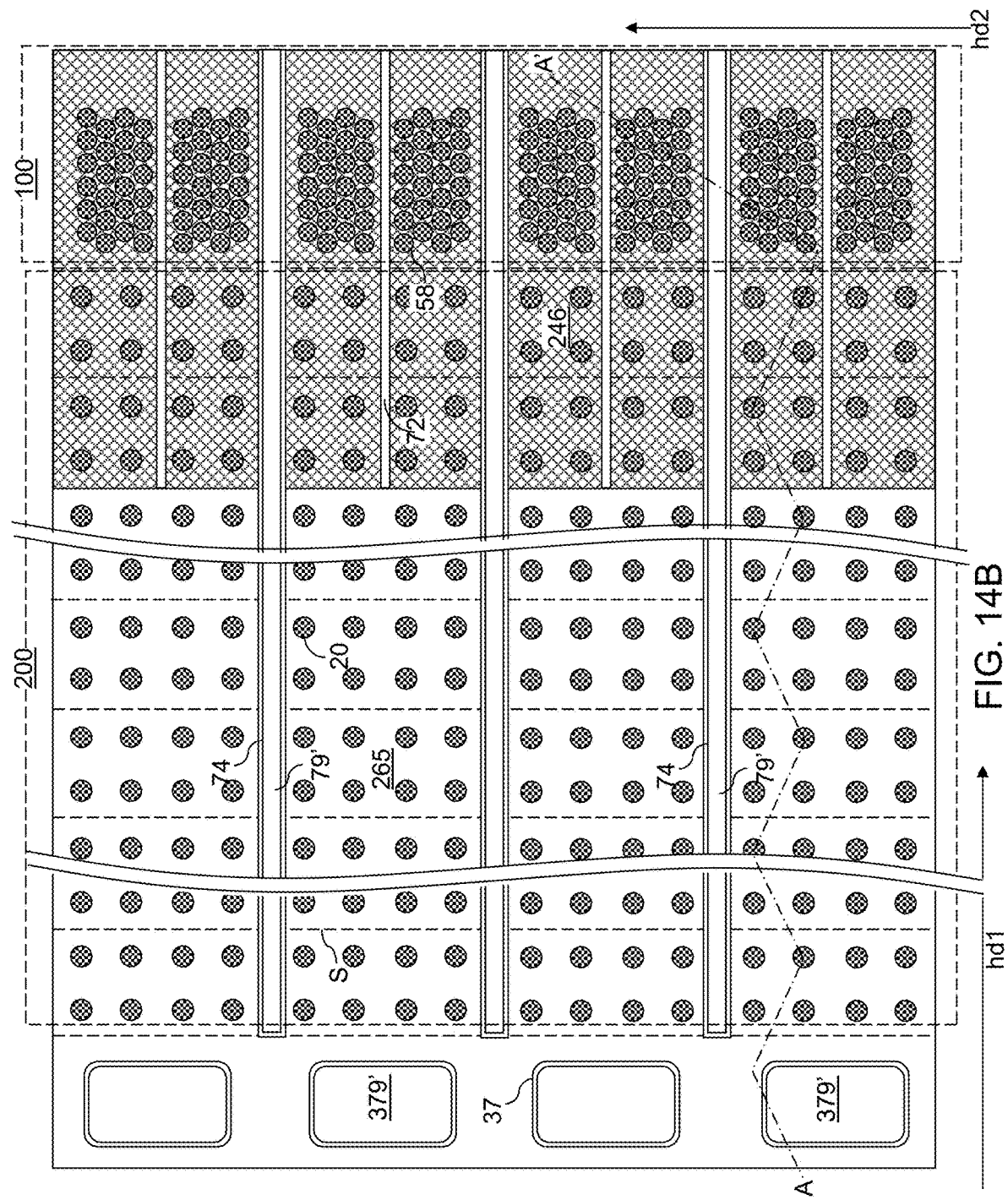
FIG. 14B is a horizontal cross-sectional of the exemplary structure along the horizontal plane B-B' of FIG. 14A. The hinged vertical plane A-A' corresponds to the plane of the vertical cross-sectional view of FIG. 14A.

Referring to FIGS. 14A and 14B, an insulating liner material layer may be conformally deposited on sidewalls of the backside trenches 79 and the via cavities 379 and on a top surface of the first contact-level dielectric material layer 280. The insulating liner material layer includes at least one dielectric material such as silicon oxide, silicon nitride, and/or at least one dielectric metal oxide. In one embodiment, the insulating liner material layer may include a silicate glass material. The thickness of the insulating liner material layer may be in a range from 10 nm to 50 nm, although lesser and greater thicknesses may also be used. The insulating liner material layer may be deposited, for example, by low pressure chemical vapor deposition.

An anisotropic etch process may be performed to anisotropically etch the insulating liner material layer. Horizontal portions of the insulating liner material layer may be removed by the anisotropic etch process. Each remaining portion of the insulating liner material layer in the backside trenches 79 constitutes a trench insulating spacer 74. Each remaining portion of the insulating liner material layer in the via cavities 379 constitutes an insulating via liner 37. Each of the trench insulating spacers 74 and the insulating via liners 37 may be topologically homeomorphic to a torus (i.e., may be continuously stretched into a torus without creation or destruction of any hole), and may have the same material composition and the same uniform lateral thickness. A top surface of the semiconductor material layer 10 may be physically exposed at the bottom of each backside trench 79, and a top surface of the substrate material layer 909 may be physically exposed at the bottom of each via cavity 379.

Figure 15:
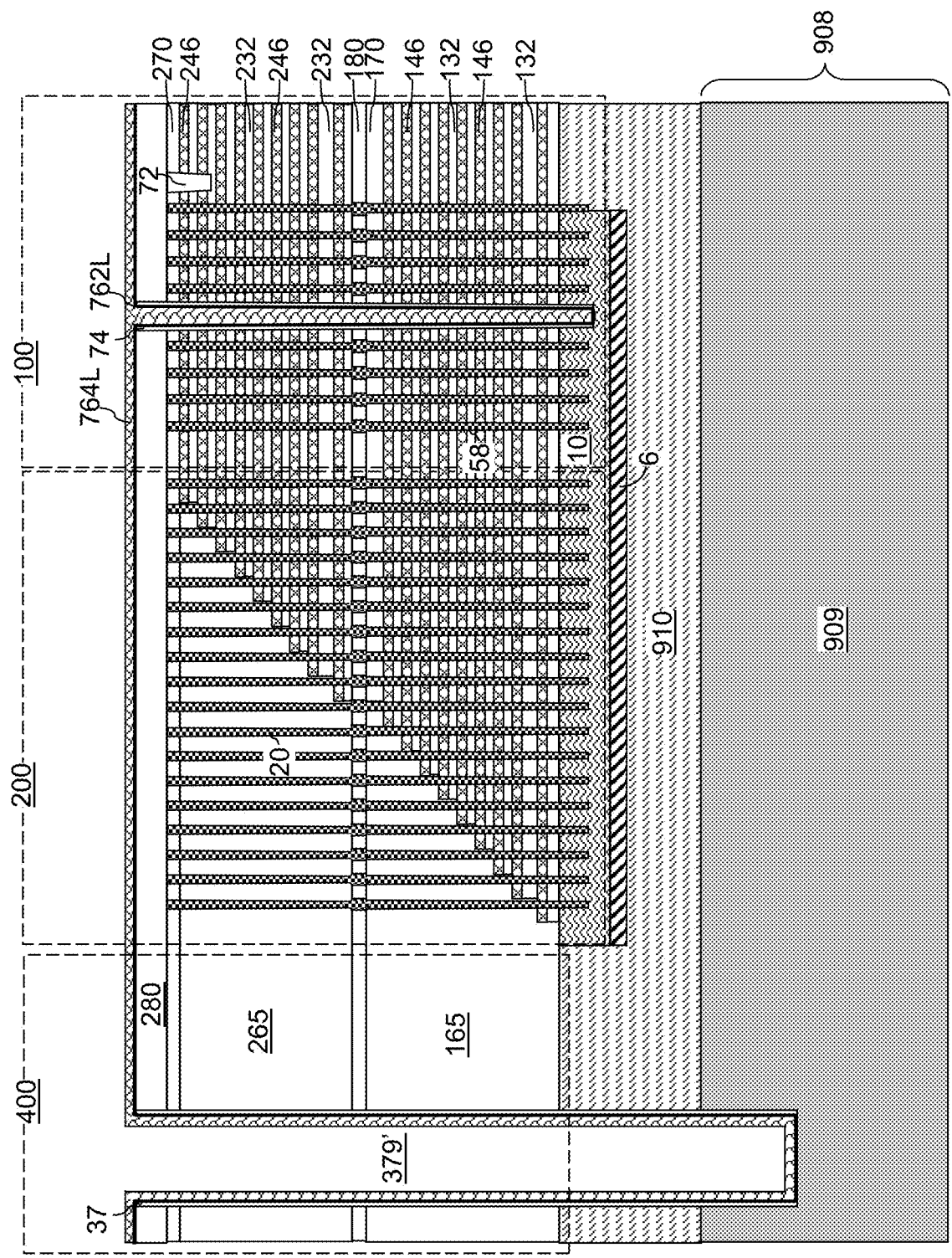
FIG. 15 is a vertical cross-sectional view of the exemplary structure after formation of a first metallic nitride liner layer and a continuous doped semiconductor material layer according to an embodiment of the present disclosure.

Referring to FIG. 15, at least one conductive material may be deposited in remaining volumes of the backside trenches 79 and the via cavities 379. For example, a first metallic nitride liner layer 762L and a continuous doped semiconductor material layer 764L may be sequentially deposited in unfilled volumes of the backside trenches 79 and the via cavities 379 conformally. The first metallic nitride liner layer 762L includes a metallic nitride material such as TiN, TaN, and/or WN. The thickness of the first metallic nitride liner layer 762L may be in a range from 5 nm to 50 nm, although lesser and greater thicknesses may also be used.

The continuous doped semiconductor material layer 764L may be heavily doped to provide high electrical conductivity. The continuous doped semiconductor material layer 764L may be doped with p-type dopants or n-type dopants. The atomic concentration of the electrical dopants in the continuous doped semiconductor material layer 764L may be in a range from $5.0 \times 10^{19}/cm^3$ to $2.0 \times 10^{21}/cm^3$, although lesser and greater dopant concentrations may also be used. In one embodiment, the continuous doped semiconductor material layer 764L may include polysilicon. The thickness of the continuous doped semiconductor material layer 764L may be selected such that the first metallic nitride liner layer 762L, and the continuous doped semiconductor material layer 764L may fill the entirety of the voids in the backside trenches 79 without completely filling the via cavities 379. In other words, an unfilled volume may be present within each via cavity 379.

Figure 16:
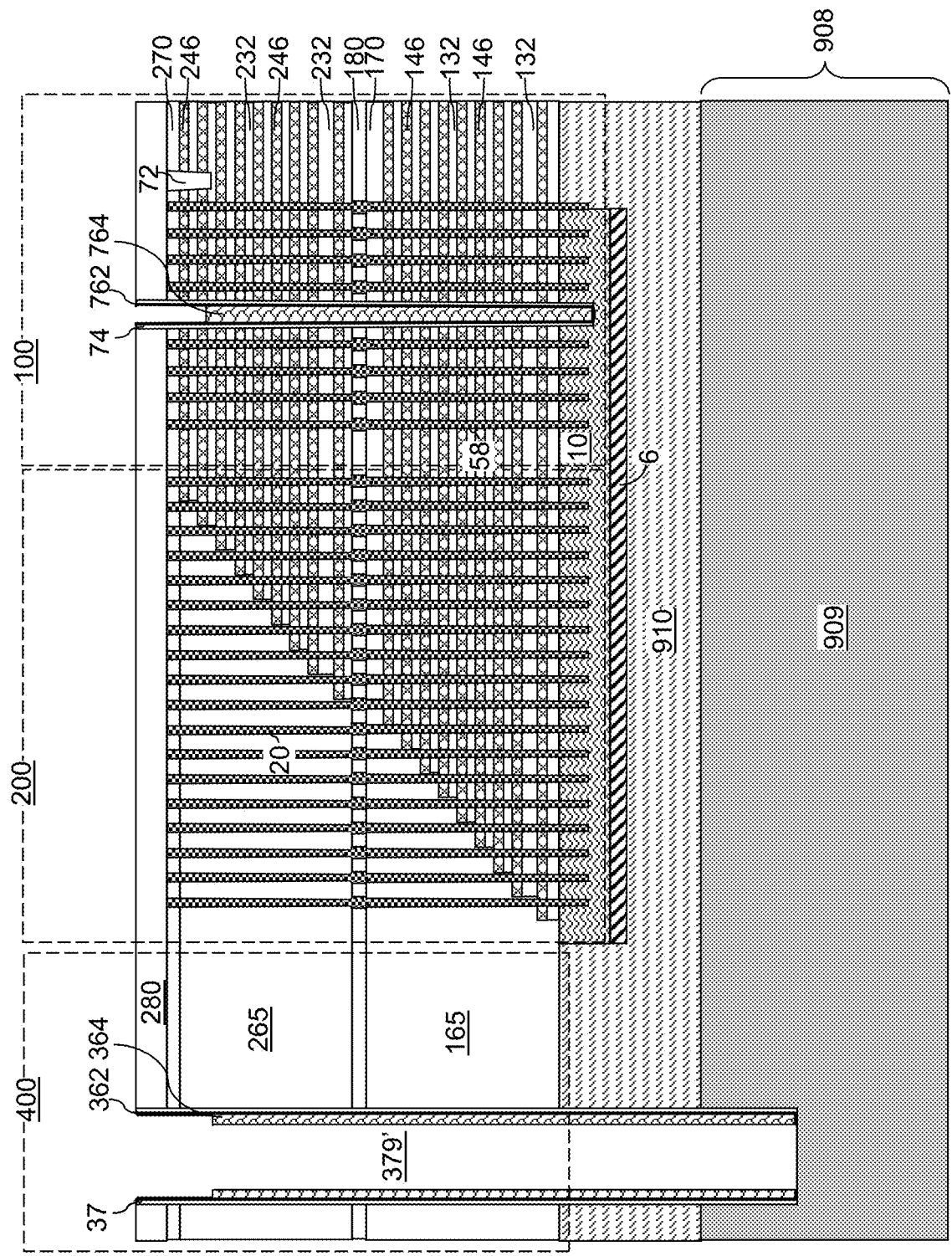
FIG. 16 is a vertical cross-sectional view of the exemplary structure after formation of a first metallic nitride liners, doped semiconductor material layers, first trench-fill metallic nitride liners, doped trench fill material portion according to an embodiment of the present disclosure.

Referring to FIG. 16, a first anisotropic etch process that recesses the material of the continuous doped semiconductor material layer 764L. Horizontal portions of the continuous doped semiconductor material layer 764L may be removed from above the first contact-level dielectric material layer 280 and at the bottom of each via cavity 379. Remaining portions of the continuous doped semiconductor material layer 764L in the backside trenches 79 may be recessed below the top surface of the first contact-level dielectric material layer 280. Each remaining portion of the continuous doped semiconductor material layer 764L in the backside trenches 79 constitutes a first conductive trench fill material portion 764. Each first conductive trench fill material portion 764 may have a top surface that is vertically recessed from the top surface of the first contact-level dielectric material layer 280. Each first conductive trench fill material portion 764 may be topologically homeomorphic to a sphere.

Remaining portions of the continuous doped semiconductor material layer 764L in the via cavities 379 may have a generally tubular configuration. Each remaining portion of the continuous doped semiconductor material layer 764L in the via cavities 379 is herein referred to as a doped semiconductor material layer 364. Each doped semiconductor material layer 364 may be topologically homeomorphic to a torus. Each doped semiconductor material layer 364 may have an annular bottom surface and an annular top surface that is vertically recessed below the horizontal plane including the top surface of the first contact-level dielectric material layer 280.

A second anisotropic etch process may be performed to remove horizontal portions of the first metallic nitride liner layer 762L. Each remaining portion of the first metallic nitride liner layer 762L in the backside trenches 79 is herein referred to as a first trench-fill metallic nitride liner 762. Each remaining portion of the first metallic nitride liner layer 762L in the via cavities 379 is herein referred to as a first metallic nitride liner 362. Each first metallic nitride liner 362 may have an opening at a bottom portion. Each doped semiconductor material layer 364 may have an annular bottom surface that contacts a top surface of a planar bottom portion of a respective first metallic nitride liner 362. An unfilled void 379' may be present within each via cavity 379. A recessed surface of the substrate material layer 909 may be physically exposed at the bottom of each unfilled void 379'.

Figure 17:
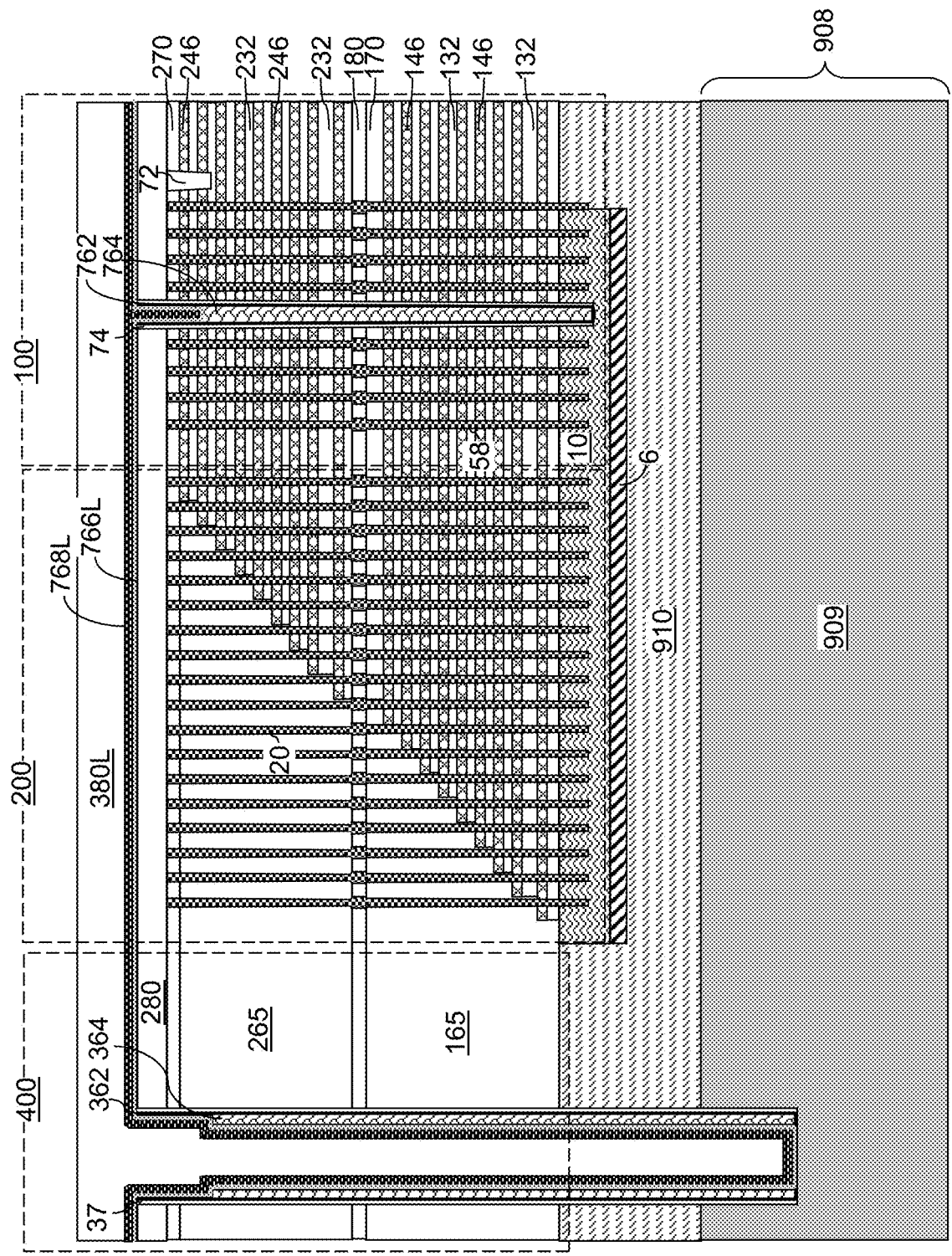
FIG. 17 is a vertical cross-sectional view of the exemplary structure after formation of a second metallic nitride liner layer, a continuous metallic material layer, and a dielectric via fill material layer according to an embodiment of the present disclosure.

Referring to FIG. 17, at least one conductive material may be deposited in remaining unfilled volumes of the backside trenches 79 and the via cavities 379. For example, a second metallic nitride liner layer 766L and a continuous metallic fill material layer 768L may be sequentially deposited in unfilled volumes of the backside trenches 79 and the via cavities 379 conformally. The second metallic nitride liner layer 766L includes a metallic nitride material such as TiN, TaN, and/or WN. The thickness of the second metallic nitride liner layer 766L may be in a range from 5 nm to 50 nm, although lesser and greater thicknesses may also be used.

The continuous metallic fill material layer 768L may include a metallic fill material such as tungsten, ruthenium, cobalt, molybdenum, copper, another elemental metal, and/or a metallic alloy including at least two elemental metals. The thickness of the continuous metallic fill material layer 768L may be selected such that the second metallic nitride liner layer 766L, and the continuous metallic fill material layer 768L fill the entirety of the voids in the backside trenches 79 without completely filling the via cavities 379.

A dielectric fill material such as silicon oxide may be deposited in unfilled volume of the via cavities 379. The dielectric fill material may completely fill remaining voids in the via cavities 379. A continuous dielectric fill material layer 380L may be formed, which continuously extends over the first contact-level dielectric material layer 280 and includes downward-protruding portions that extend into center portions of the via cavities 379.

Figure 18A:
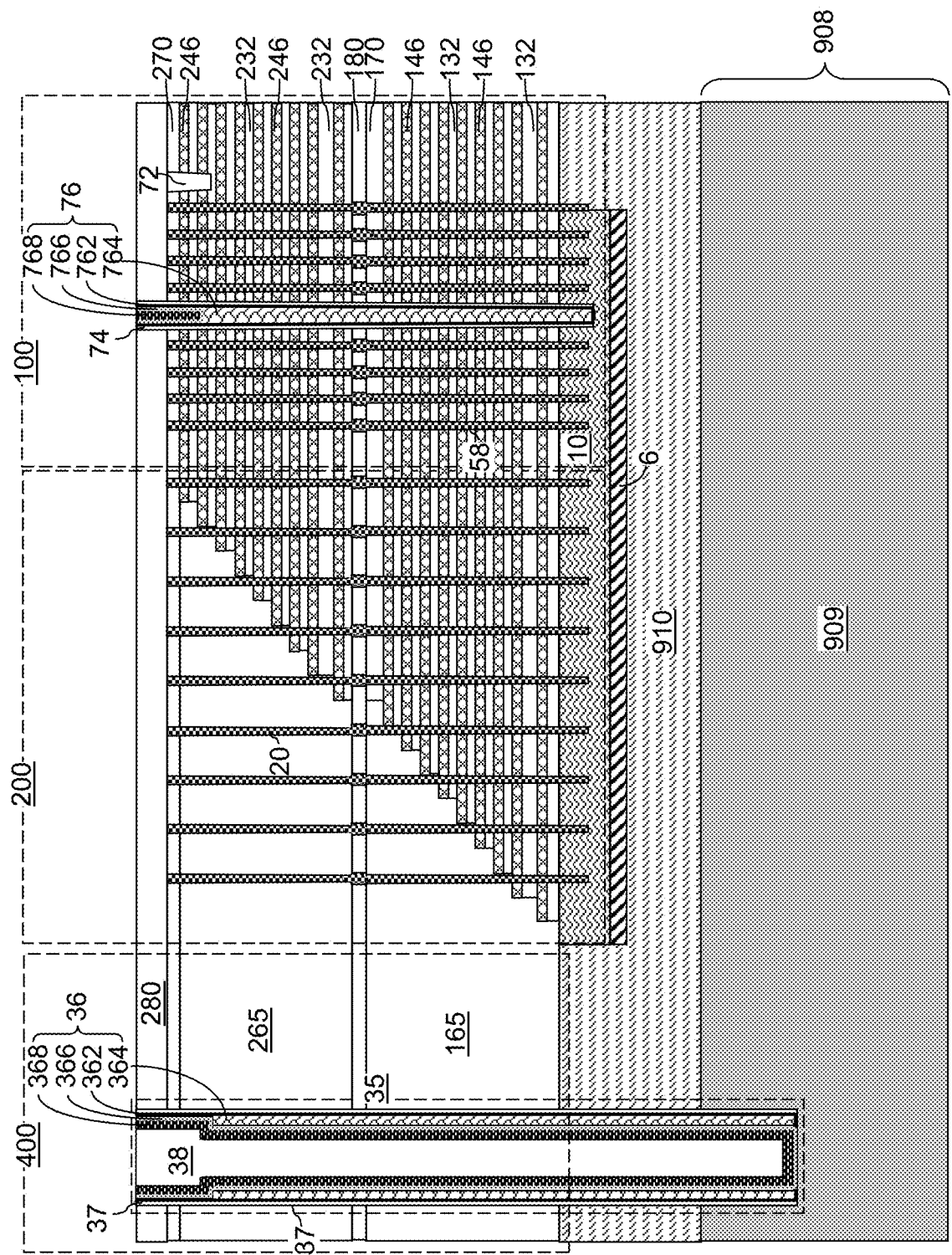
FIG. 18A is a vertical cross-sectional view of the exemplary structure after a planarization process that forms via fill assemblies and trench fill structures according to an embodiment of the present disclosure.
Figure 18B:
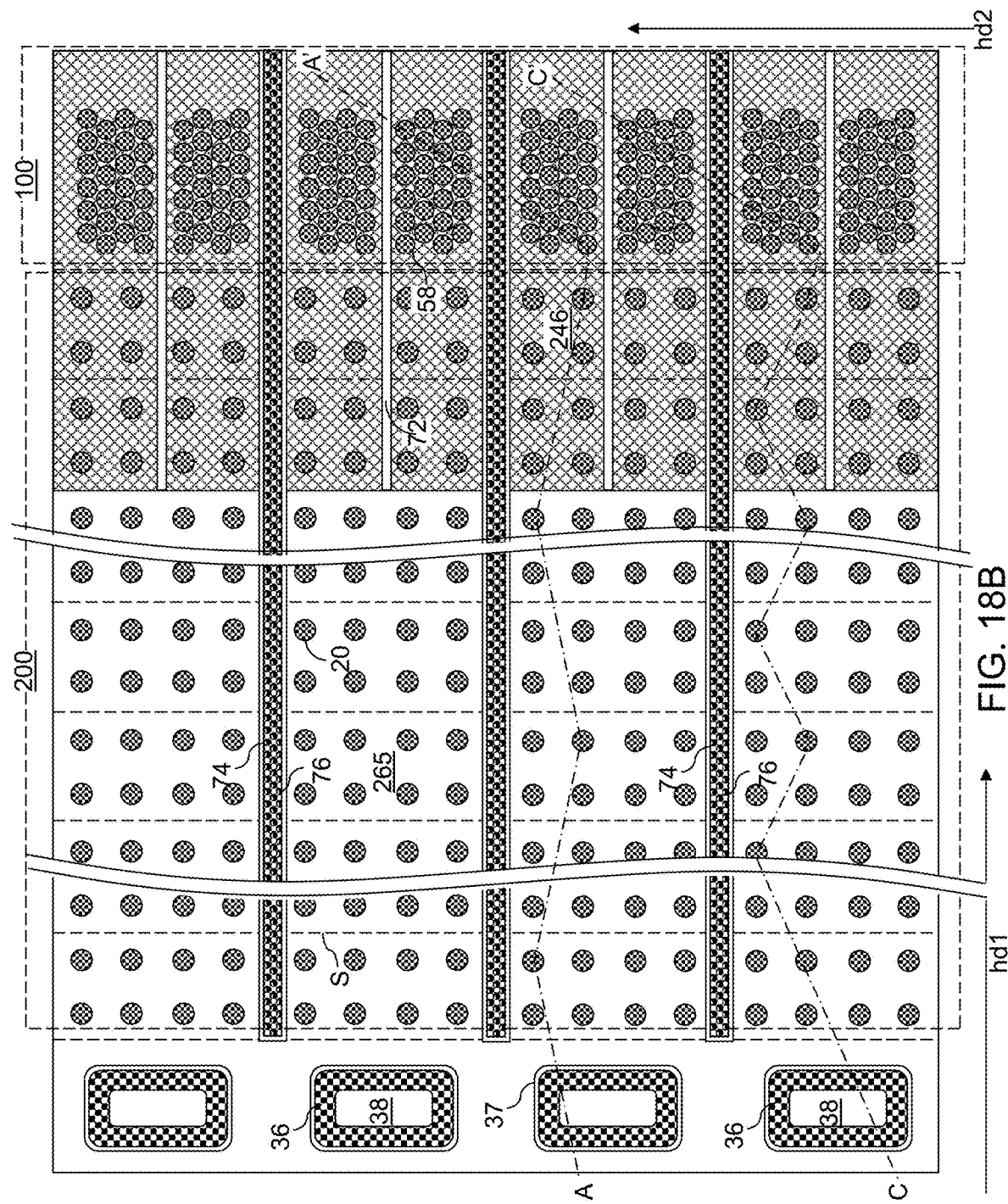
FIG. 18B is a top-down view of the exemplary structure of FIG. 18A.
Figure 18C:
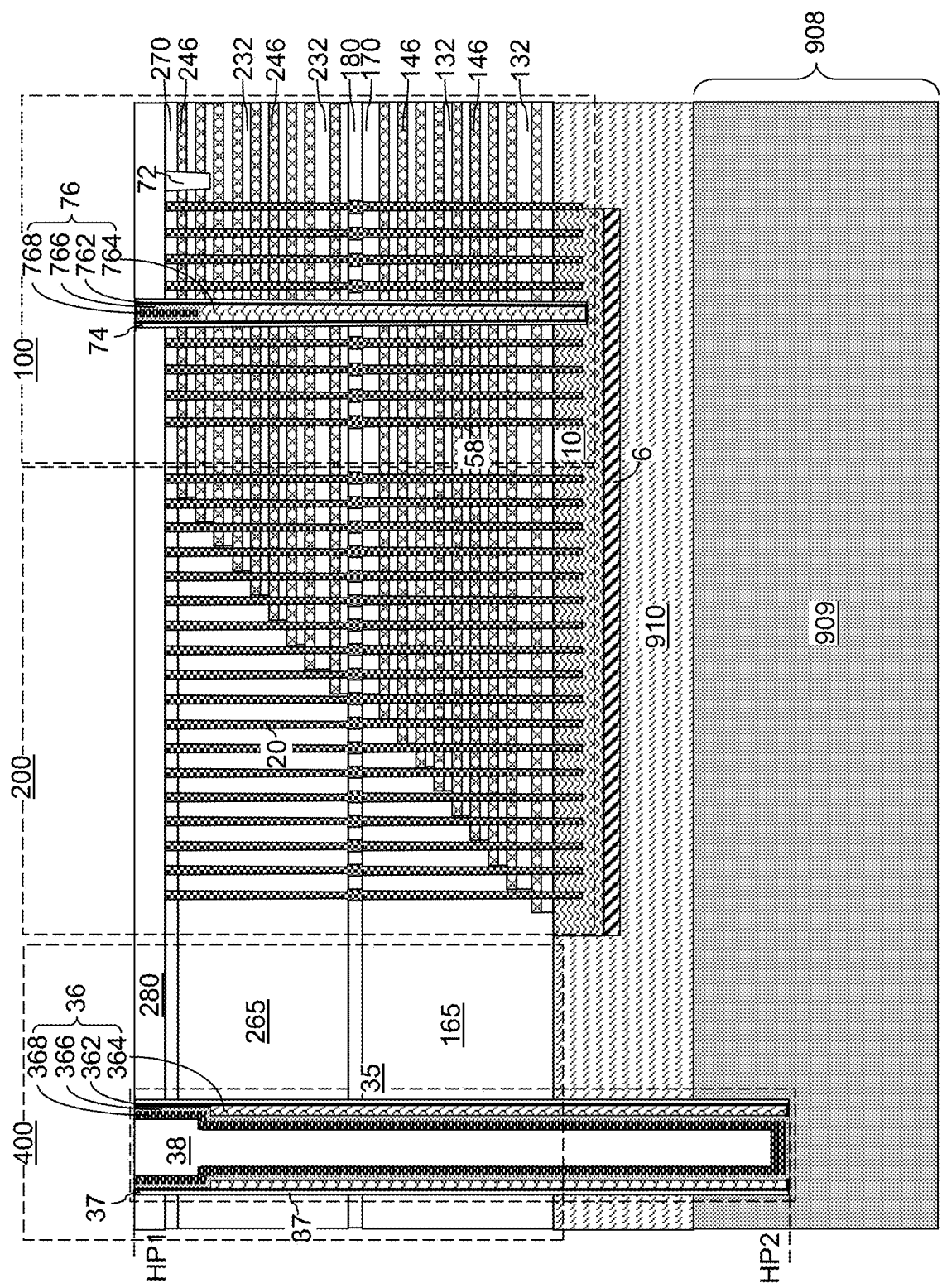
FIG. 18C is a vertical cross-sectional view of the exemplary structure along the hinged vertical cross-sectional plane C-C' of FIG. 18B.

Referring to FIGS. 18A-18C, a planarization process such as a chemical mechanical planarization (CMP) process may be performed to remove portions of the continuous dielectric fill material layer 380L, the continuous metallic fill material layer 768L, and the second metallic nitride liner layer 766L from above the horizontal plane including the top surface of the first contact-level dielectric material layer 280. Each remaining portion of the second metallic nitride liner layer 766L in a backside trench 79 constitutes a second trench-fill metallic nitride liner 766. Each remaining portion of the continuous metallic fill material layer 768L in a backside trench 79 constitutes a second conductive trench fill material portion 768. Each remaining portion of the second metallic nitride liner layer 766L in the via cavities 379 constitutes a second metallic nitride liner 366. Each remaining portion of the continuous metallic fill material layer 768L in a via cavity 379 constitutes a metallic material layer 368 including a horizontal plate portion (a bottom portion) and a vertical portion having a generally tubular shape. Each vertical portion of the metallic material layer 368 includes a first segment that is located at the level of, and is laterally surrounded by, a doped semiconductor material layer 364, and a second segment located above the doped semiconductor material layer 364 and having a greater lateral extent than the first segment. An annular step segment may join the first segment and the segment within each metallic material layer 368. Each remaining portion of the continuous dielectric fill material layer 380L constitutes a dielectric via core 38.

Generally, at least one conductive material may be deposited in the backside trenches 79 and the via cavities 379. The backside trenches 79 may be completely filled with the at least one conductive material, and the via cavities 379 may be only partially filled with the at least one conductive material. A combination of a doped semiconductor material and at least one metallic material may be used as the at least one conductive material to reduce mechanical stress, which may be excessively high if only metallic materials are used to fill the backside trenches 79. The remaining volumes of the via cavities 379 may be filled with a dielectric material, which forms the dielectric via cores 38 and absorbs mechanical stress from the at least one conductive material in the via cavities 379.

The set of all material portions that fills a backside trench 79 is herein referred to as a trench fill structure (74, 76). Each trench fill structure (74, 76) includes a trench insulating spacer 74 and a trench contact via structure 76. Each trench contact via structure 76 may include a first trench-fill metallic nitride liner 762, a first conductive trench fill material portion 764, a second trench-fill metallic nitride liner 766, and a second conductive trench fill material portion 768. Thus, a trench fill structure (74, 76) is formed within each backside trench 79.

The set of all material portions that fills a via cavity 379 is herein referred to as a via structure assembly 35. Each via structure assembly 35 includes an insulating via liner 37, a conductive via structure 36 that includes remaining portions of the at least one conductive material deposited in a respective via cavity 379, and a dielectric via core 38 that includes a remaining portion of the continuous dielectric fill material layer 380L. Each conductive via structure 36 may include a first metallic nitride liner 362, a doped semiconductor material layer 364, a second metallic nitride liner 366, and a metallic material layer 368.

Generally, each via structure assembly 35 may vertically extend through at least one dielectric material portion (such as the second retro-stepped dielectric material portion 265 and the first retro-stepped dielectric material portion 165) and through an upper portion of the substrate material layer 909 (e.g., extend partially into the substrate 908) with a straight sidewall (which may be a cylindrical sidewall) that extends from a horizontal plane including the top surface of the first contact-level dielectric material layer 280 to a horizontal plane including the bottom surface of the via structure assembly 35. The straight sidewall may be vertical or tapered with a taper angle less than 5 degrees. Each conductive via structure 36 may include a tubular conductive portion extending from the topmost surface of a via structure assembly 35 to a bottommost surface of the via structure assembly 35. A dielectric via core 38 may be located within the tubular conductive portion of the conductive via structure 36. A source-side dielectric material layer 910 may be located between the semiconductor material layer 10 and the substrate material layer 909. The via structure assembly 35 may extend through the source-side dielectric material layer 910, and may be laterally spaced from the semiconductor material layer 10.

Figure 19A:
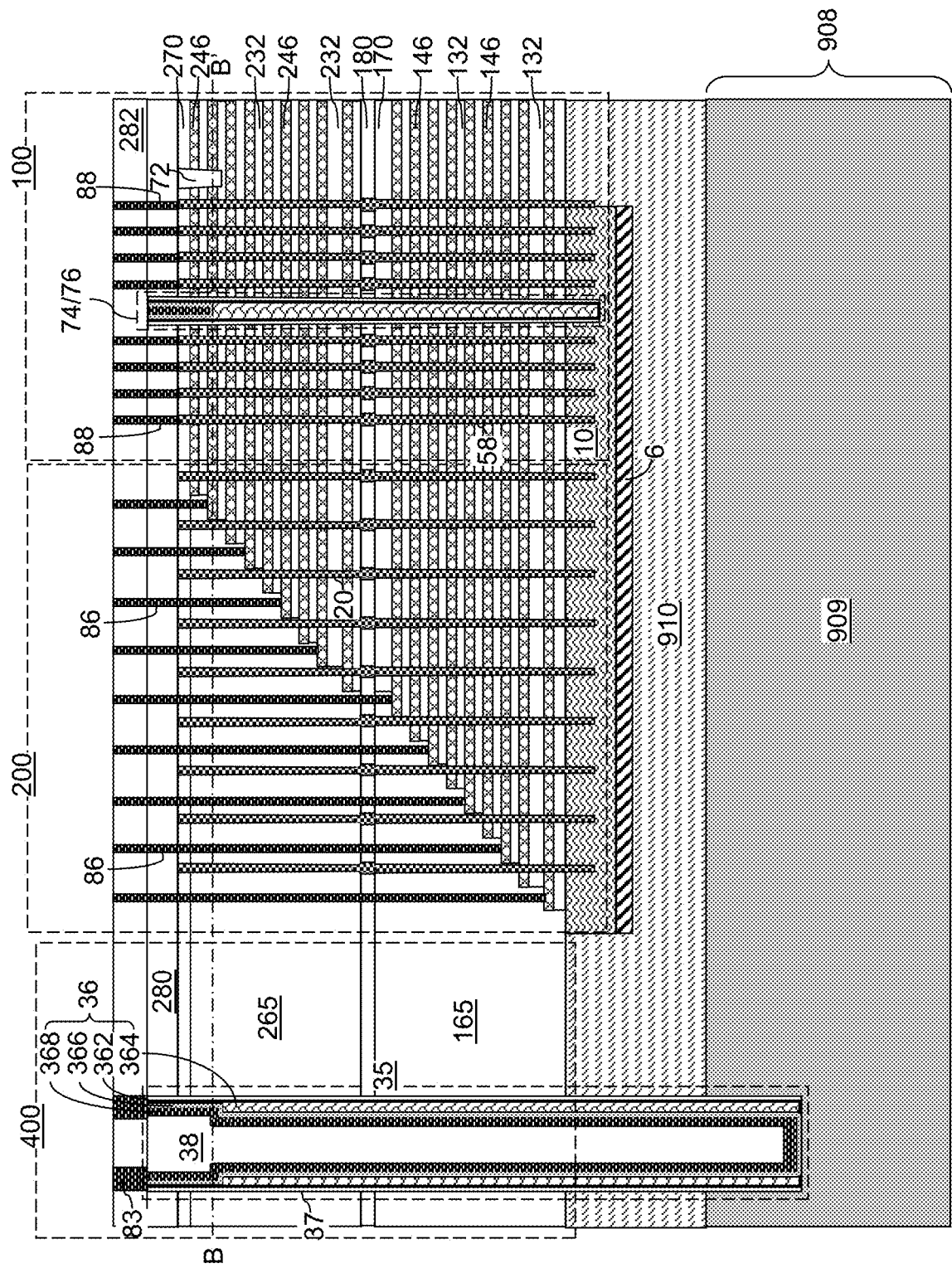
FIG. 19A is a vertical cross-sectional view of the exemplary structure after formation of a second contact-level dielectric layer and various contact via structures according to an embodiment of the present disclosure.
Figure 19C:
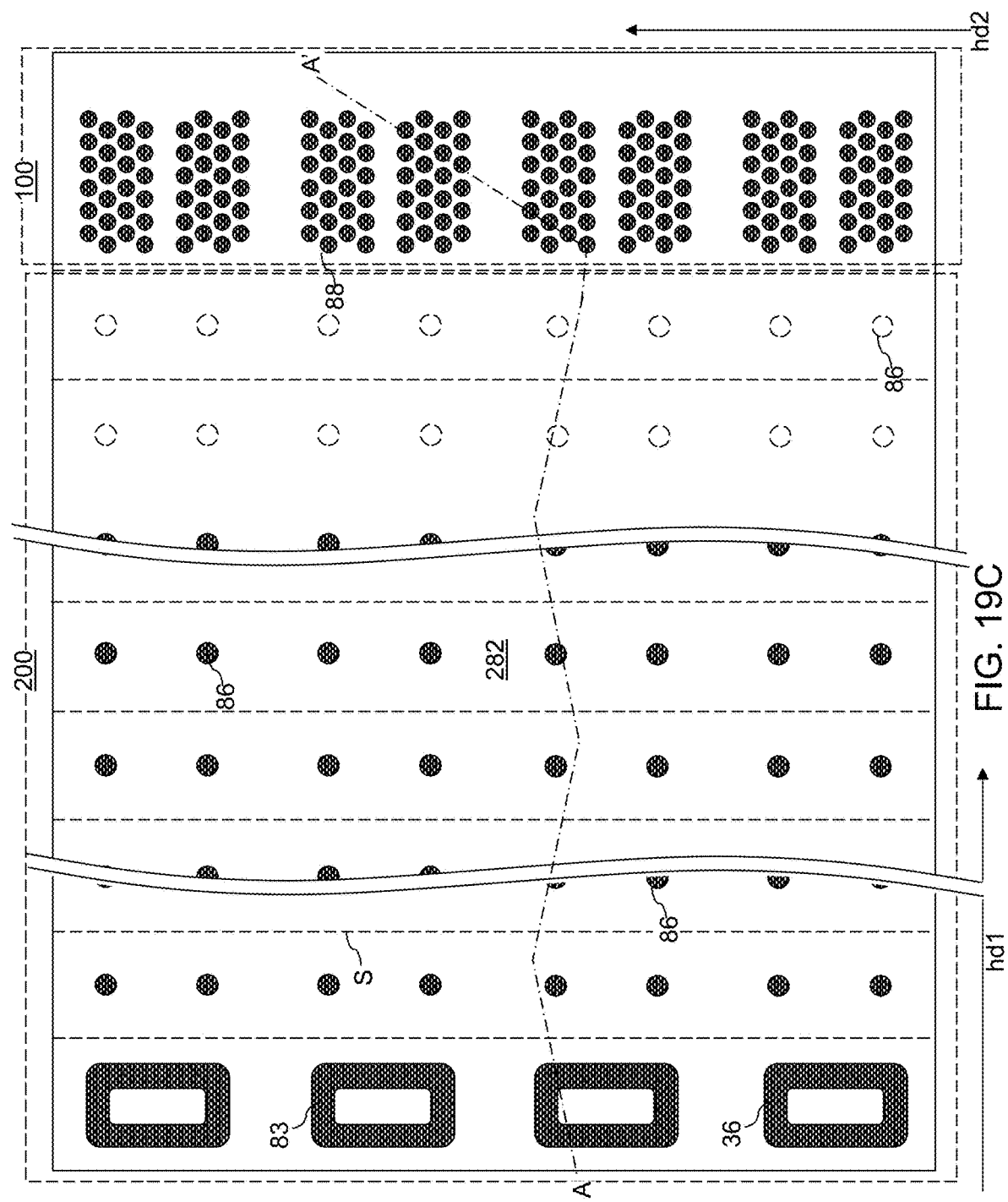
FIG. 19C is a top-down view of the exemplary structure of FIGS. 19A and 19B.

Referring to FIGS. 19A-19C, a second contact-level dielectric layer 282 may be formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures 88 may be formed in the memory array region 100, and openings for forming staircase region contact via structures 86 may be formed in the staircase region 200. Opening for forming extension via structures 83 may be formed in the via interconnection region 400 directly on a top surface of a respective one of the conductive via structures 36.

An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146, 246) at the stepped surfaces underlying the first and second stepped dielectric material portions (165, 265). An extension via cavity may be formed over each of the conductive via structures 36. The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55. An extension via structure 83 may be formed directly on a top surface of a respective one of the conductive via structures 36. The photoresist layer may be subsequently removed, for example, by ashing.

Figure 20:
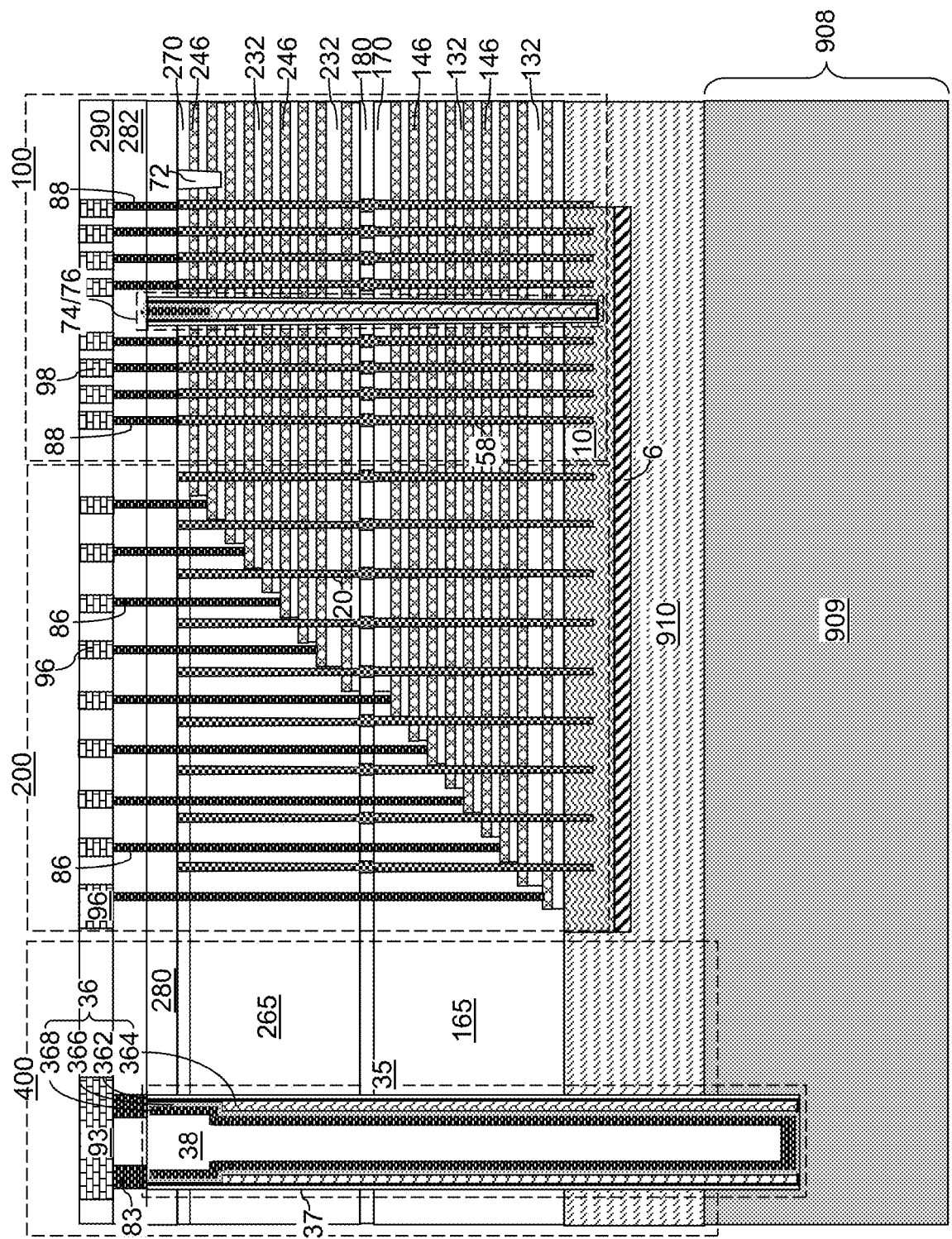
FIG. 20 is a vertical cross-sectional view of the exemplary structure after formation of metal line structures according to an embodiment of the present disclosure.

Referring to FIG. 20, at least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86. The upper-level metal interconnect structures may further include via-connection metal lines 93 that contact a respective one of the extension via structures 83.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 908 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 908, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 908, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

Figure 21:
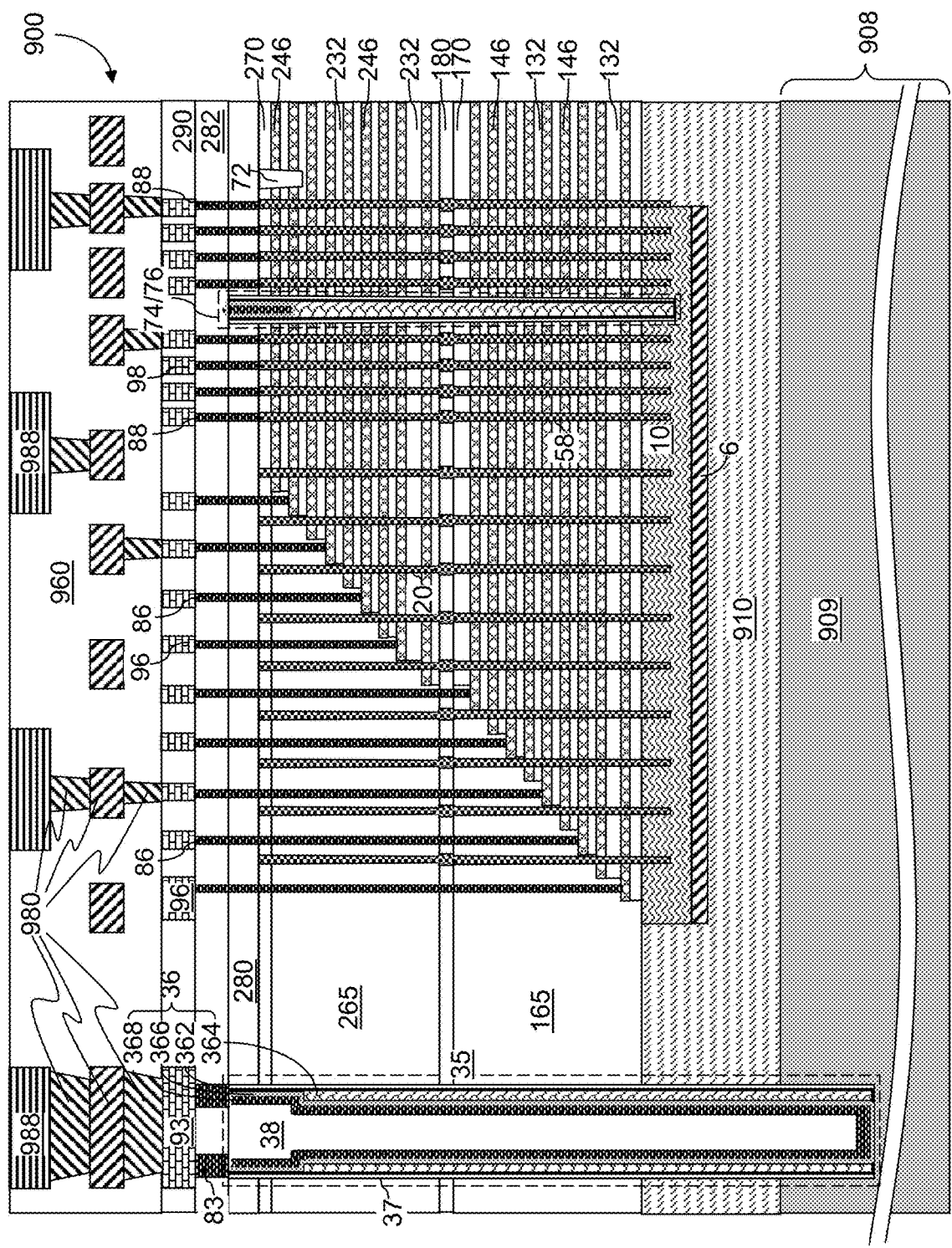
FIG. 21 is a vertical cross-sectional view of the exemplary structure that includes a memory die after formation of additional dielectric material layers and interconnect-side bonding pads according to an embodiment of the present disclosure.

Referring to FIG. 21, dielectric material layers 960 may be deposited over the line-level dielectric layer 290. Various additional memory-die metal interconnect structures 980 may be formed in the dielectric material layers 960. Generally, the various metal interconnect structures (88, 86, 98, 96, 980) may be formed in the combination of the first contact-level dielectric layer 280, the second contact-level dielectric layer 282, the line-level dielectric layer 290, and the dielectric material layers 960 with appropriate shifting of metal interconnect levels. The thickness of the dielectric material layers 960 may be in a range from 300 nm to 3,000 nm, although lesser and greater thicknesses may also be used.

Pad cavities may be formed in the upper portion of the additional memory-die metal interconnect structures 980 such that a respective one of the memory-die metal interconnect structures 980 is exposed at the bottom of each pad cavity. In one embodiment, the pad cavities may be arranged as a one-dimensional array or as a two-dimensional array, and may have a respective polygonal, circular, elliptical, or generally-curvilinear shape.

A conductive material may be deposited in the pad cavities to form memory-die bonding pads 988, which are also referred to as memory-die bonding pads. The memory-die bonding pads 988 may include source-network memory-side bonding pads electrically connected to the semiconductor material layer 10, word-line-connection memory-side bonding pads that are electrically connected to a respective one of the electrically conductive layers (146, 246) that function word lines, and bit-line-connection memory-side bonding pads that are electrically connected to the bit lines 98. The exemplary structure comprises a memory die 900, which are also referred to as a first semiconductor die.

The memory die 900 may include an alternating stack of insulating layers (132, 232) and word lines comprising a subset of the electrically conductive layers (146, 246). The alternating stack {(132, 146), (232, 246)} may have stepped surfaces in which a subset of the electrically conductive layers (146, 246) has a lateral extent that increases with a distance from a bonding surface of the memory die 900 including the memory-die bonding pads 988. Memory stack structures 55 vertically extend through the alternating stack {(132, 146), (232, 246)}. Each of the memory stack structures 55 include a respective vertical semiconductor channel 60 and a respective set of vertically stacked memory elements located at levels of the electrically conductive layers (146, 246). Each set of vertically stacked memory elements may include portions of a charge storage layer 54 located at the levels of the electrically conductive layers (146, 246). Word line contact via structures (which are a subset of staircase-region contact via structures 86 that contact a subset of the electrically conductive layers 146 that function as word lines) may contact a respective one of the word lines. Each of the word line contact via structures vertically extend from a respective one of the word lines toward the bonding surface of the memory die 900. Generally, the memory-die bonding pads 988 may be formed on the metal interconnect structures (88, 86, 98, 96, 980) to provide a memory die 900. The memory die 900 includes a substrate 908, memory stack structures 55, trench fill structures (74, 76), via structure assemblies 35, metal interconnect structures (88, 86, 98, 96, 980), and memory-die bonding pads 988.

Figure 22:
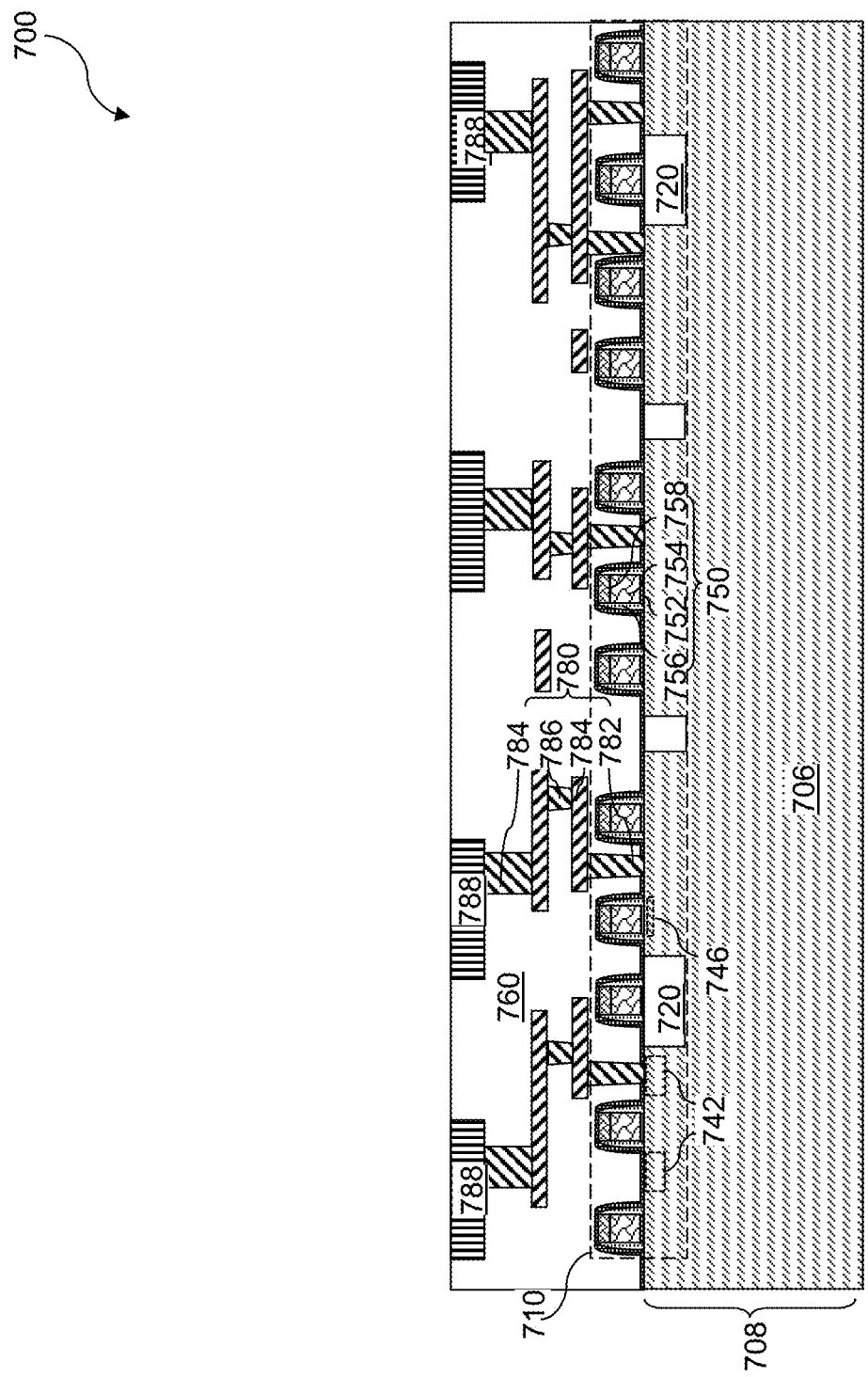
FIG. 22 is a vertical cross-sectional view of a support die including a peripheral circuitry for the memory die according to an embodiment of the present disclosure.

Referring to FIG. 22, a support die 700 is illustrated. The support die 700 may include a support-die substrate 708, which includes a substrate semiconductor layer 706. The support die 700 may include various semiconductor devices 710 formed on the substrate semiconductor layer 706. In one embodiment, the semiconductor devices 710 include a peripheral circuitry for operation of the three-dimensional memory arrays in the memory die 900. Specifically, the peripheral circuitry may be configured to operate memory elements located within the memory stack structures 55 of the memory die 900. The peripheral circuitry may include a word line driver that drives word lines of the three-dimensional memory array (comprising the electrically conductive layers (146, 246)) within the memory die 900, a bit line driver that drives the bit lines 98 in the memory die 900, a word line decoder circuit that decodes the addresses for the electrically conductive layers (146, 246), a bit line decoder circuit that decodes the addresses for the bit lines 98, a sense amplifier circuit that senses the states of memory elements within the memory stack structures 55 in the memory die 900, a source power supply circuit that provides power to the semiconductor material layer 10 in the memory die 900, a data buffer and/or latch, or any other semiconductor circuit that may be used to operate the array of memory stack structures 55 in the memory die 900.

Shallow trench isolation structures 720 may be provided through the substrate semiconductor layer 706 to provide electrical isolation from the various semiconductor devices 710. The various semiconductor devices 710 may include field effect transistors, which include respective transistor active regions 742 (i.e., source regions and drain regions), a channel 746, and a gate structure 750. The field effect transistors may be arranged in a CMOS configuration. Each gate structure 750 may include, for example, a gate dielectric 752, a gate electrode 754, a dielectric gate spacer 756 and a gate cap dielectric 758. For example, the semiconductor devices 710 may include word line drivers for electrically biasing word lines of the memory die 900, which comprise the electrically conductive layers (146, 246), and source power supply field effect transistors that generate power to be supplied to the semiconductor material layer in the memory die 900. In one embodiment, the semiconductor devices 710 of the support die 700 may include complementary metal-oxide-semiconductor (CMOS) devices.

Dielectric material layers are formed over the semiconductor devices 710, which are herein referred to as support-die dielectric material layers 760. Optionally, a dielectric liner (such as a silicon nitride liner) may be formed to apply mechanical stress to the various field effect transistors and/or to prevent diffusion of hydrogen or impurities from the support-die dielectric material layers 760 into the semiconductor devices 710. Support-die metal interconnect structures 780 are formed within the support-die dielectric material layers 760. The support-die metal interconnect structures 780 may include various device contact via structures 782 (e.g., source and drain electrodes which contact the respective source and drain nodes of the device or gate electrode contacts), interconnect-level metal line structures 784, and interconnect-level metal via structures 786. Support-die bonding pads 788 may be formed on a respective one of the support-die metal interconnect structures 780. The support-die bonding pads 788 are configured to mate with the memory-side bonding pads 988 of a memory die 900, or to source-side bonding pads to be subsequently formed on a memory die 900, to provide electrically conductive paths between the memory die 900 and the support die 700.

Figure 23:
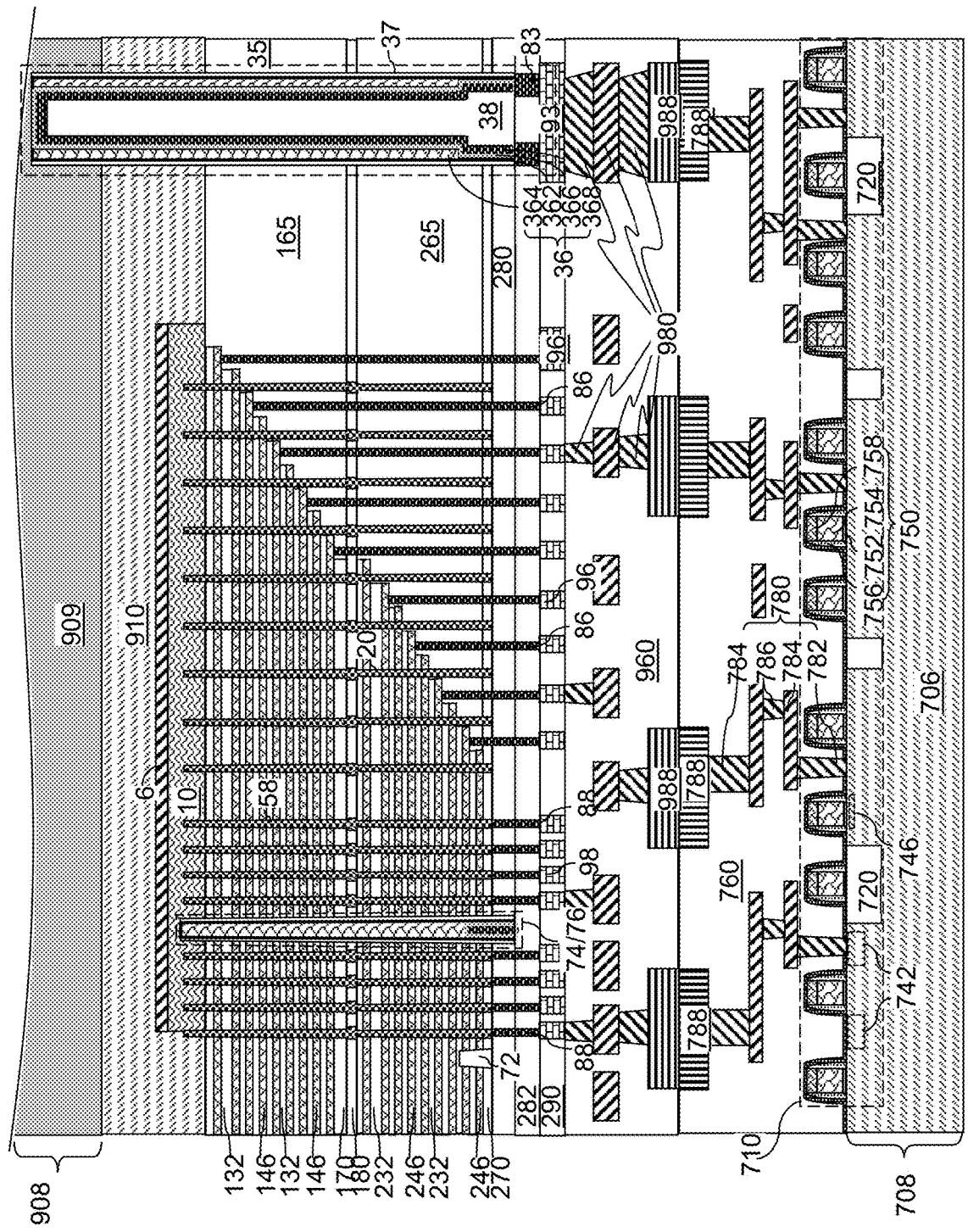
FIG. 23 is a vertical cross-sectional view of an exemplary bonded assembly formed by bonding the support die to the memory die according to an embodiment of the present disclosure.

Referring to FIG. 23, an exemplary bonded assembly according to an embodiment of the present disclosure is illustrated, which may be formed by bonding the memory-side bonding pads 988 of the memory die 900 to the support-die bonding pads 788 of the support die 700. Metal-to-metal bonding may be used to bond the memory die 900 to the support die 700. The memory die 900 and the support die 700 may be disposed such that the memory-side bonding pads 988 contact a respective one of the support-die bonding pads 788, and metal-to-metal bonding may be induced between contacting pairs of the support-die bonding pads 788 and the memory-side bonding pads 988 by performing an anneal process at an elevated temperature. For example, copper-to-copper bonding may be used in case the memory-side bonding pads 988 and the support-die bonding pads 788 include copper portions.

Figure 24:
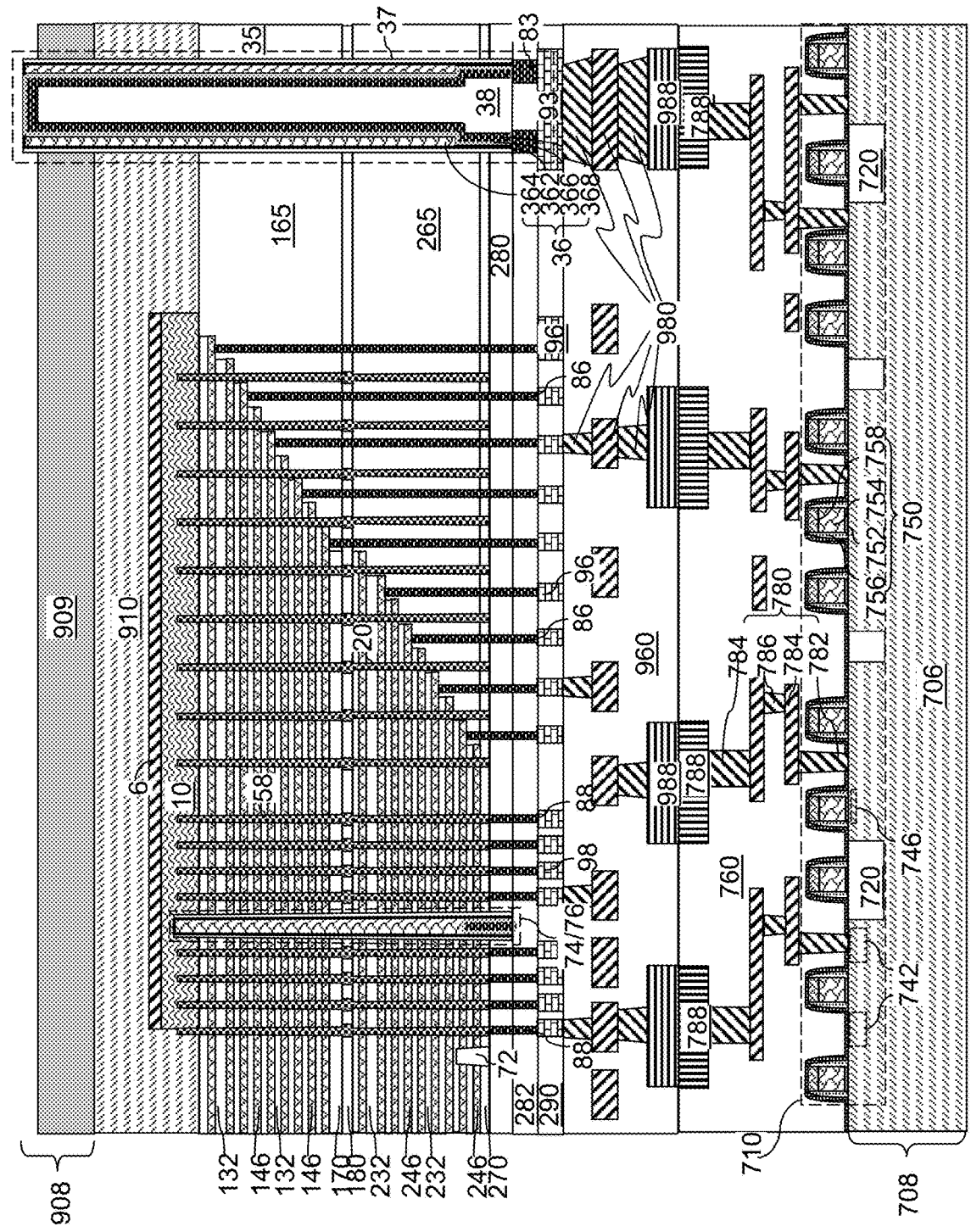
FIG. 24 is a vertical cross-sectional view of the exemplary bonded assembly after thinning a substrate material layer of the memory die according to an embodiment of the present disclosure.

Referring to FIG. 24, the substrate material layer 909 (e.g., the silicon wafer) of the memory die 900 may be thinned from the backside. Grinding, polishing, an isotropic etch process, an anisotropic etch process, or a combination thereof many be used to thin the substrate material layer 909. In one embodiment, the substrate material layer 909 may be a commercially available silicon substrate having a thickness in a range from 500 microns to 1 mm, and the thickness of the substrate material layer 909 after thinning may be in a range from 2 nm to 60 nm, such as from 4 nm to 30 nm, although the thinned substrate material layer 909 may have In one embodiment, an isotropic etch process (such as a wet etch using a KOH solution) or an anisotropic etch process may be performed after top surfaces of the via structure assemblies 35 are physically exposed to vertically recess a planar backside surface of the substrate material layer 909 below the horizontal plane including top surfaces of the via structure assemblies 35. However, since the backside trenches 79 are shallower than the via cavities 379 and do not extend as deep into or above the substrate material layer 909, the trench fill structures (74, 76) in the backside trenches 79 are not physically exposed after the thinning process is completed. The recess depth may be in a range from 100 nm to 3 microns, although lesser and greater recess depths may also be used.

Figure 25A:
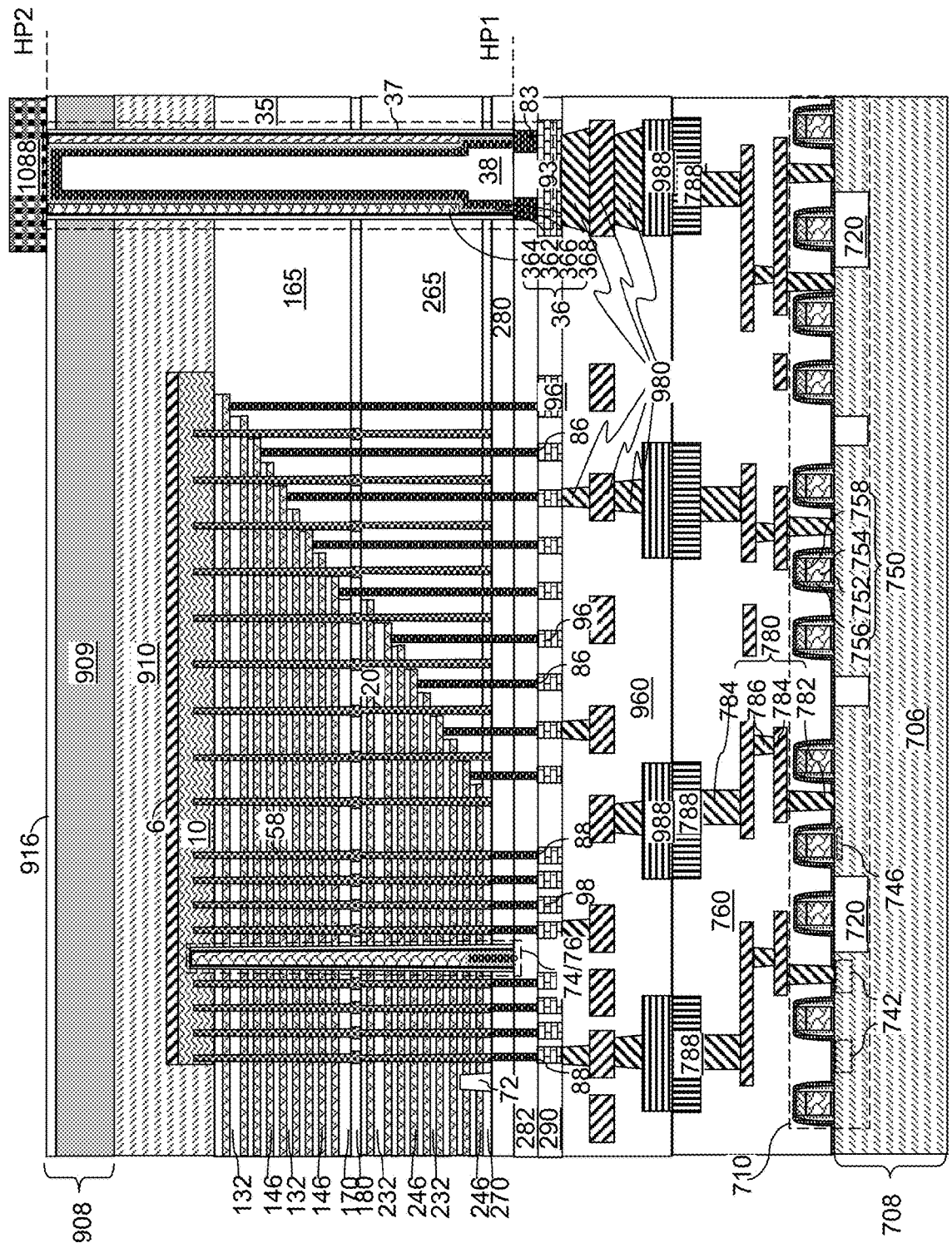
FIG. 25A is a vertical cross-sectional view of a first configuration of the exemplary bonded assembly after formation of a backside insulating layer and external bonding pads according to an embodiment of the present disclosure.
Figure 25B:
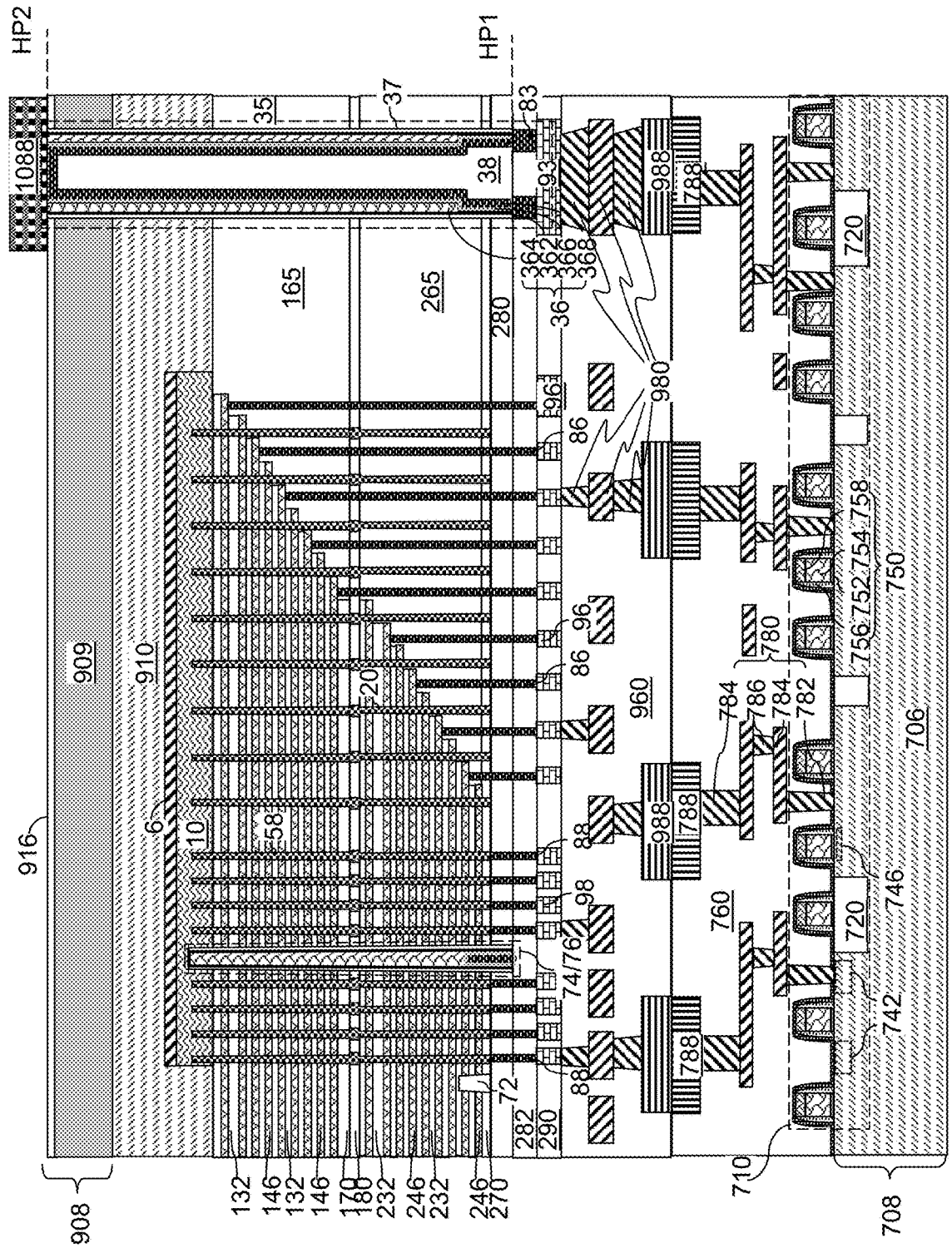
FIG. 25B is a vertical cross-sectional view of a second configuration of the exemplary bonded assembly after formation of a backside insulating layer and external bonding pads according to an embodiment of the present disclosure.

Referring to FIGS. 25A and 25B, a backside insulating layer 916 may be formed on the backside surface of the substrate material layer 909. The backside insulating layer 916 includes a dielectric material such as silicon oxide. In one embodiment, the backside insulating layer 916 may be formed by oxidation of the surface portions of the semiconductor material of the substrate material layer 909. Alternatively, or additionally, the backside insulating layer 916 may be formed by deposition and planarization of a dielectric material such as silicon oxide. Depending on whether portions of the second metallic nitride liner 366 are removed from the metallic material layers 368 during the planarization process or not, planar portions of the second metallic nitride liner 366 may cover the metallic material layers 368 as illustrated in FIG. 25A, or top surfaces of the metallic material layers 368 may be physically exposed after the planarization process as illustrated in FIG. 25B. A bonding pad 1088 may be formed on a physically exposed top surface of each via structure assembly 35.

Referring to all drawings and according to various embodiments of the present disclosure, a semiconductor structure comprising a memory die 900 is provided. The memory die 900 comprises: an alternating stack {(132, 146), (232, 246)} of insulating layers (132, 146) and electrically conductive layers (232, 246) located between a substrate 908 and metal interconnect structures 980 formed within dielectric material layers 960; memory stack structures 55 extending through the alternating stack {(132, 146), (232, 246)}; at least one dielectric material portion (165, 265) located between the substrate 908 and the metal interconnect structures 980 and adjacent to the alternating stack {(132, 146), (232, 246)}; and a via structure assembly 35 vertically extending through the at least one dielectric material portion (165, 265) and through the substrate 908 with a straight sidewall that extends from a first horizontal surface that contacts one of the metal interconnect structures 980 and located at a first horizontal plane HP1 to a second horizontal surface that is located at a second horizontal plane HP2 and contacts a bonding pad 1088 located on an outer surface of the substrate 908, wherein the via structure 35 assembly comprises: a tubular conductive portion extending from the first horizontal surface to the second horizontal surface; a planar conductive portion (such as a horizontal portion of a second metallic nitride liner 366 and/or a metallic material layer 368) contacting the bonding pad 1088 at the second horizontal surface; and a dielectric via core 38 located within the tubular conductive portion.

In one embodiment, each of the memory stack structures 55 comprises a vertical semiconductor channel 60 and a memory film 50 contacting the vertical semiconductor channel 60 and including a vertical stack of memory elements.

In one embodiment, each of the memory stack structures 55 is located entirely between, and is vertically spaced from each of, the first horizontal plane HP1 and the second horizontal plane HP2.

In one embodiment, the semiconductor structure comprises: drain regions 63 contacting a first end of a respective one of the vertical semiconductor channels 60; a semiconductor material layer 10 electrically connected to a second end of each of the memory stack structures 55 and located between the alternating stack {(132, 146), (232, 246)} and the substrate 908.

In one embodiment, the semiconductor structure comprises a source-side dielectric material layer 910 located between the semiconductor material layer 10 and the substrate 908, wherein the via structure assembly 35 extends through the source-side dielectric material layer 910 and is laterally spaced from the semiconductor material layer 10.

In one embodiment, the semiconductor structure comprises a trench contact via structure 76 vertically extending through the alternating stack {(132, 146), (232, 246)} and contacting a portion of the semiconductor material layer 10 and comprising a same set of conductive materials as the via structure assembly 35.

In one embodiment, the via structure assembly 35 comprises an insulating via liner 37 laterally surrounding the tubular conductive portion; and a trench insulating spacer 74 laterally surrounds the trench contact via structure 76, wherein the trench insulating spacer 74 comprises a same dielectric material as the insulating via liner 37 and has a same thickness as the insulating via liner 37.

In one embodiment, the insulating via liner 37 extends from the first horizontal plane HP1 to the second horizontal plane HP2; and the trench insulating spacer 74 is located entirely between, and is vertical spaced from each of, the first horizontal plane HP1 and the second horizontal plane HP2.

In one embodiment, the via structure assembly 35 comprises: a doped semiconductor material layer 364 including a vertical portion located within the tubular conductive portion; and a metallic material layer 368 including a vertical portion located within the tubular conductive portion and contacting the dielectric via core 38.

In one embodiment, the metallic material layer 368 contacts the one of the metal interconnect structures 980; and the doped semiconductor material layer 364 is vertically spaced from the first horizontal plane HP1.

In one embodiment, the via structure assembly 35 comprises: a first metallic nitride liner 362 extending from the first horizontal plane HP1 to the second horizontal plane HP2 and contacting the bonding pad 1088 at the second horizontal plane HP2 and contacting, and laterally surrounding, the doped semiconductor material layer 364. In one embodiment, the via structure assembly 35 comprises a second metallic nitride liner 366 extending from the first horizontal plane HP1 toward the second horizontal plane HP2, contacting and laterally surrounding the dielectric via core 38, and contacting and laterally surrounded by the doped semiconductor material layer 364.

In one embodiment, a horizontal surface of the second metallic nitride liner 366 may directly contacts the bonding pad 1088. The horizontal surface may be a planar surface without any opening inside a periphery thereof, or may be an annular surface having an opening therethrough. If the horizontal surface of the second metallic nitride liner 366 has an opening therethrough, the metallic material layer 368 may directly contact the bonding pad 1088.

In one embodiment, the semiconductor structure may comprise a support die 700 bonded to the memory die 900. The support die 700 may comprise a peripheral circuitry configured to operate memory elements located within the memory stack structures 55.

The various embodiments of the present disclosure provide simultaneous formation of the via structure assemblies 35 and the trench fill structures (74, 76), thereby providing savings in the manufacturing cost. Particularly, a same anisotropic etch process may be used to form backside trenches 79 and via cavities 379. Because the alternating stacks {(132, 142), (232, 242)} may have a large number of material layers and a significant thickness, the processing cost for forming deep trenches or deep cavities may be high. Simultaneous formation of the via structure assemblies 35 and the trench fill structures (74, 76) may significantly reduce the processing cost. Further, the dielectric via cores 38 may absorb mechanical stress generated from the conductive materials within the via structure assemblies 35. The various embodiments reduce the processing cost by reducing the etching process needed in conventional processing methods to form the via structure assemblies 35 in part due to the processing steps used to form the trench fill structures (74, 76). In the various embodiments, the need for sacrificial polysilicon filling of the via cavities of conventional methods may be eliminated. Moreover, the need to remove the filled sacrificial polysilicon is also no longer needed. Thus, the number of processing steps and processing costs may be reduced.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a memory die, wherein the memory die comprises:
    a substrate comprising a top surface and an outer surface opposite to the top surface;
    an alternating stack of insulating layers and electrically conductive layers located between the top surface of the substrate and metal interconnect structures that overlie the alternating stack;
    memory stack structures extending through the alternating stack;
    at least one dielectric material portion located adjacent to the alternating stack between the substrate and the metal interconnect structures; and
    a via structure assembly vertically extending through the at least one dielectric material portion and through the substrate, the via structure assembly comprising a straight sidewall that extends from a first horizontal surface that contacts one of the metal interconnect structures and located at a first horizontal plane to a second horizontal surface that is located at a second horizontal plane and contacts a bonding pad located on the outer surface of the substrate within the second horizontal plane, wherein the via structure assembly comprises:
        a tubular conductive portion extending from the first horizontal surface to the second horizontal surface;
        a planar conductive portion contacting the bonding pad at the second horizontal surface; and
        a dielectric via core located within the tubular conductive portion.

2. The semiconductor structure of claim 1, wherein each of the memory stack structures comprises a vertical semiconductor channel and a memory film contacting the vertical semiconductor channel.

3. The semiconductor structure of claim 2, wherein each of the memory stack structures is located entirely between, and is vertically spaced from each of, the first horizontal plane and the second horizontal plane.

4. The semiconductor structure of claim 2, further comprising drain regions contacting a first end of a respective one of the vertical semiconductor channels.

5. The semiconductor structure of claim 4, further comprising a semiconductor material layer electrically connected to a second end of each of the memory stack structures and located between the alternating stack and the substrate.

6. The semiconductor structure of claim 5, further comprising a trench contact via structure vertically extending through the alternating stack and contacting a portion of the semiconductor material layer and comprising a same set of conductive materials as the via structure assembly.

7. The semiconductor structure of claim 6, wherein:
    the via structure assembly comprises an insulating via liner laterally surrounding the tubular conductive portion; and
    a trench insulating spacer laterally surrounds the trench contact via structure, wherein the trench insulating spacer comprises a same dielectric material as the insulating via liner and has a same thickness as the insulating via liner.

8. The semiconductor structure of claim 7, wherein:
    the insulating via liner extends from the first horizontal plane to the second horizontal plane; and
    the trench insulating spacer is located entirely between, and is vertical spaced from each of, the first horizontal plane and the second horizontal plane.

9. The semiconductor structure of claim 1, wherein the via structure assembly comprises:
    a doped semiconductor material layer including a vertical portion located within the tubular conductive portion; and
    a metallic material layer including a vertical portion located within the tubular conductive portion and contacting the dielectric via core.

10. The semiconductor structure of claim 9, wherein:
    the metallic material layer contacts the one of the metal interconnect structures; and
    the doped semiconductor material layer is vertically spaced from the first horizontal plane.

11. The semiconductor structure of claim 10, wherein the via structure assembly comprises a first metallic nitride liner extending from the first horizontal plane to the second horizontal plane and contacting the bonding pad at the second horizontal plane and contacting and laterally surrounding the doped semiconductor material layer.

12. The semiconductor structure of claim 11, wherein the via structure assembly comprises a second metallic nitride liner extending from the first horizontal plane toward the second horizontal plane, contacting and laterally surrounding the dielectric via core, and contacting and laterally surrounded by the doped semiconductor material layer.

13. The semiconductor structure of claim 12, wherein the second metallic nitride liner directly contacts the bonding pad.

14. The semiconductor structure of claim 11, further comprising a support die bonded to the memory die and comprising a peripheral circuitry configured to operate memory elements located within the memory stack structures.

15. A semiconductor structure comprising:
    a memory die; and
    a support die bonded to the memory die;
    wherein the memory die comprises:
        a substrate comprising a top surface and an outer surface opposite to the top surface;
        an alternating stack of insulating layers and electrically conductive layers located between the top surface of the substrate and metal interconnect structures that overlie the alternating stack;
        memory stack structures extending through the alternating stack;
        at least one dielectric material portion located adjacent to the alternating stack between the substrate and the metal interconnect structures; and
        a via structure assembly vertically extending through the at least one dielectric material portion and through the substrate, the via structure assembly comprising a straight sidewall that extends from a first horizontal surface that contacts one of the metal interconnect structures and located at a first horizontal plane to a second horizontal surface that is located at a second horizontal plane and contacts a bonding pad located on the outer surface of the substrate within the second horizontal plane, wherein the via structure assembly comprises:
  a tubular conductive portion extending from the first horizontal surface to the second horizontal surface;
  a planar conductive portion contacting the bonding pad at the second horizontal surface; and
  a dielectric via core located within the tubular conductive portion; and
wherein the support die comprises a peripheral circuitry configured to operate memory elements located within the memory stack structures.

16. The semiconductor structure of claim 15, wherein:
the memory die further comprises memory-die bonding pads formed on the metal interconnect structures; and
the support die further comprises support-die bonding pads bonded to the memory-die bonding pads.

\* \* \* \* \*